(12) United States Patent
Rajagopal et al.

(10) Patent No.: US 9,929,724 B2
(45) Date of Patent: Mar. 27, 2018

(54) SCHMITT TRIGGER CIRCUIT AND NON-VOLATILE MEMORY DEVICE INCLUDING THE SAME

(71) Applicant: SAMSUNG ELECTRONICS CO., LTD., Suwon-si, Gyeonggi-do (KR)

(72) Inventors: Devraj Matharampallil Rajagopal, Suwon-si (KR); Kyoung-Tae Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/995,575

(22) Filed: Jan. 14, 2016

(65) Prior Publication Data

US 2016/0241220 A1   Aug. 18, 2016

(30) Foreign Application Priority Data

Feb. 13, 2015   (KR) .......................... 10-2015-0022079

(51) Int. Cl.
*H03K 3/00* (2006.01)
*H03K 3/3565* (2006.01)
*H03K 3/356* (2006.01)

(52) U.S. Cl.
CPC ..... *H03K 3/3565* (2013.01); *H03K 3/356104* (2013.01)

(58) Field of Classification Search
None
See application file for complete search history.

(56) References Cited

U.S. PATENT DOCUMENTS

| 3,984,703 | A | * | 10/1976 | Jorgensen | ............ | H03K 3/3565 |
| | | | | | | 327/206 |
| 5,519,348 | A | | 5/1996 | Tanoi | | |
| 5,869,999 | A | | 2/1999 | Mawet | | |
| 6,366,123 | B1 | * | 4/2002 | Liu | ....................... | H03K 3/3565 |
| | | | | | | 327/108 |
| 6,501,288 | B1 | | 12/2002 | Wilsher | | |
| 6,518,823 | B1 | | 2/2003 | Kawai | | |

(Continued)

FOREIGN PATENT DOCUMENTS

| JP | 07-162281 A | 6/1995 |
| KR | 1020030057819 A | 7/2003 |
| KR | 1020090088669 A | 8/2009 |

*Primary Examiner* — Long Nguyen
(74) *Attorney, Agent, or Firm* — Volentine & Whitt, PLLC

(57) ABSTRACT

A Schmitt trigger circuit includes a first inverter, second inverter, first feedback unit, and second feedback unit. The first inverter includes a PMOS transistor unit and an NMOS transistor unit which generate an internal signal by inverting an input signal based on a first feedback signal and provide the internal signal to a first node. A second inverter generates an output signal by inverting the first signal. A first feedback unit generates a first feedback signal providing a first hysteresis character to a first unit among the PMOS transistor unit and NMOS transistor unit based on a first signal of the first node. A second feedback unit generates a second feedback signal providing a second hysteresis character to a second unit among the PMOS transistor unit and NMOS transistor unit based on the output signal. The second feedback unit provides the second feedback signal to the first node.

11 Claims, 14 Drawing Sheets

(56) References Cited

U.S. PATENT DOCUMENTS

| | | | |
|---|---|---|---|
| 6,934,215 B2 * | 8/2005 | Chung | H03K 5/1565 |
| | | | 365/194 |
| 7,772,887 B2 | 8/2010 | Shankar et al. | |
| 7,969,218 B2 | 6/2011 | Lee | |
| 2012/0062274 A1 | 3/2012 | Yamaguchi | |
| 2013/0043922 A1 * | 2/2013 | Srivastava | H03K 19/0013 |
| | | | 327/208 |
| 2013/0088274 A1 * | 4/2013 | Gu | H03K 5/131 |
| | | | 327/231 |

* cited by examiner

SCHMITT TRIGGER CIRCUIT AND NON-VOLATILE MEMORY DEVICE INCLUDING THE SAME

CROSS-REFERENCE TO RELATED APPLICATION

This U.S. non-provisional application claims priority under 35 USC § 119 to Korean Patent Application No. 10-2015-0022079, filed on Feb. 13, 2015, in the Korean Intellectual Property Office (KIPO), the disclosure of which is incorporated by reference in its entirety herein.

BACKGROUND

1. Technical Field

Example embodiments relate generally to a Schmitt trigger circuit, and more particularly to a Schmitt trigger circuit which has a high and an equal hysteresis character at low supply voltage, and a phase interpolator including the same.

2. Discussion of the Related Art

In general, a Schmitt trigger circuit generates an output signal by stabilizing a logical level of an input signal as a logical high level or logical low level.

In a conventional Schmitt trigger circuit, when a voltage level of a supply voltage is low, a hysteresis character when the input signal transfers from a logical high level to a logical low level may be reduced because a current driving power of a PMOS transistor included in the Schmitt trigger circuit is reduced.

SUMMARY

At least one example embodiment of the disclosure provides a Schmitt trigger circuit having a high and equal hysteresis character at a low supply voltage.

At least one example embodiment of the disclosure provides a phase interpolator including a Schmitt trigger circuit having a high and equal hysteresis character at a low supply voltage.

At least one example embodiment of the disclosure provides a non-volatile memory device including a Schmitt trigger circuit having a high and equal hysteresis character at a low supply voltage.

According to example embodiments, a Schmitt trigger circuit includes a first inverter, a second inverter, a first feedback unit, and a second feedback unit. The first inverter includes a PMOS transistor unit and an NMOS transistor unit which generate an internal signal by inverting an input signal based on a first feedback signal and provide the internal signal to a first node. The second inverter generates an output signal by inverting a first signal of the first node. The first feedback unit generates the first feedback signal providing a first hysteresis character to a first unit among the PMOS transistor unit and the NMOS transistor unit based on the first signal of the first node. The second feedback unit generates a second feedback signal providing a second hysteresis character to a second unit among the PMOS transistor unit and the NMOS transistor unit based on the output signal. The second feedback unit provides the second feedback signal to the first node. The second hysteresis character has the same size as the first hysteresis character.

In an example embodiment, the PMOS transistor unit and the NMOS transistor unit may have different current driving power when a supply voltage is low. A ratio of the first feedback signal and the second feedback signal may be controlled according to a ratio of the current driving powers of the PMOS transistor unit and the NMOS transistor unit such that the first hysteresis character and the second hysteresis character have the same size.

In an example embodiment, the first unit may be the NMOS transistor unit and the second unit may be the PMOS transistor unit. The PMOS transistor unit may include a first PMOS transistor having a gate terminal receiving the input signal, a source terminal receiving a supply voltage, and a drain terminal connected to the first node. The NMOS transistor unit may include a first NMOS transistor and a second NMOS transistor. The first NMOS transistor may have a gate terminal receiving the input signal, a drain terminal connected to a second node, and a source terminal receiving a ground voltage. The second NMOS transistor may have a gate terminal receiving the input signal, a drain terminal connected to the first node, and a source terminal connected to the second node. The first feedback unit may include a third NMOS transistor having a gate terminal connected to the first node, a drain terminal receiving the supply voltage, and a source terminal connected the second node. The third NMOS transistor may provide the first feedback signal to the second node. The second feedback unit may include a fourth NMOS transistor having a gate terminal receiving the output signal, a drain terminal connected to the first node, and a source terminal receiving the ground voltage. The fourth NMOS transistor may provide the second feedback signal to the first node. A channel width/length (W/L) ratio of the third NMOS transistor and a W/L ratio of the fourth NMOS transistor may be controlled such that the first hysteresis character and the second hysteresis character have the same size.

In an example embodiment, the Schmitt trigger circuit may further include a second PMOS transistor having a gate terminal receiving the output signal, a drain terminal receiving the supply voltage, and a source terminal connected to the first node. The second PMOS transistor may provide a third feedback signal, which provides a supplemental hysteresis character to the NMOS transistor unit, to the first node.

In an example embodiment, a voltage level of the output signal may be changed from a logical low level to a logical high level when the voltage level of the output signal is the logical low level and a voltage level of the input signal increases through a first trigger voltage. The first trigger voltage may be determined based on a turn-on resistance of the first NMOS transistor and a turn-on resistance of the third NMOS transistor.

In an example embodiment, a voltage level of the output signal may be changed from a logical high level to a logical low level when the voltage level of the output signal is the logical high level and a voltage level of the input signal decreases through a second trigger voltage. The second trigger voltage may be determined based on a current driving power of the first PMOS transistor and a current driving power of the fourth NMOS transistor.

In an example embodiment, the first unit may be the PMOS transistor unit and the second unit may be the NMOS transistor unit. The PMOS transistor unit may include a first PMOS transistor and a second PMOS transistor. The first PMOS transistor may have a gate terminal receiving the input signal, a source terminal receiving a supply voltage, and a drain terminal connected to a second node. The second PMOS transistor may have a gate terminal receiving the input signal, a source terminal connected to the second node, and a drain terminal connected to the first node. The first feedback unit may include a third PMOS transistor having a gate terminal connected to the first node, a drain terminal connected to the second node, and a source terminal receiving a ground voltage. The third PMOS transistor may provide the first feedback signal to the second node. The NMOS transistor unit may include a first NMOS transistor having a gate terminal receiving the input signal, a drain terminal connected to the first node, and a source terminal receiving the ground voltage. The second feedback unit may include a fourth PMOS transistor having a gate terminal receiving the output signal, a source terminal receiving the supply voltage, and a drain terminal connected to the first node. The fourth PMOS transistor may provide the second feedback signal to the first node. A W/L ratio of the third PMOS transistor and a W/L ratio of the fourth PMOS transistor may be controlled such that the first hysteresis character and the second hysteresis character have the same size.

In an example embodiment, the Schmitt trigger circuit may further include a second NMOS transistor having a gate terminal receiving the output signal, a drain terminal connected to the first node, and a source terminal receiving the ground voltage. The second NMOS transistor may provide a third feedback signal, which a supplemental hysteresis character to the PMOS transistor unit, to the first node.

In an example embodiment, a voltage level of the output signal may be changed from a logical low level to a logical high level when the voltage level of the output signal is the logical low level and a voltage level of the input signal increases through a first trigger voltage. The first trigger voltage may be determined based on a current driving power of the first NMOS transistor and a current driving power of the fourth PMOS transistor.

In an example embodiment, a voltage level of the output signal may be changed from a logical high level to a logical low level when the voltage level of the output signal is the logical high level and a voltage level of the input signal decreases through a second trigger voltage. The second trigger voltage may be determined based on a turn-on resistance of the first PMOS transistor and a turn-on resistance of the third PMOS transistor.

In an example embodiment, when the first unit is the PMOS transistor unit, the PMOS transistor unit comprises two PMOS transistors connected in series and the PMOS transistor unit receives the first feedback signal at a second node that directly interconnects a drain of one of the two PMOS transistors and a source of the other of the two PMOS transistors. When the first unit is the NMOS transistor unit, the NMOS transistor unit comprises two NMOS transistors connected in series and the NMOS transistor unit receives the first feedback signal at a third node that directly interconnects a drain of one of the two NMOS transistors and a source of the other of the two NMOS transistors.

In an example embodiment, when the first unit is the PMOS transistor unit, the first feedback unit comprises a PMOS transistor. When the first unit is the NMOS transistor unit, the first feedback unit comprises an NMOS transistor.

In an example embodiment, when the first unit is the PMOS transistor unit, the second feedback unit comprises a PMOS transistor. When the first unit is the NMOS transistor unit, the second feedback unit comprises an NMOS transistor.

In an example embodiment, the first unit comprises two transistors connected in series and the second unit comprises one transistor, the first feedback signal is received by a node that directly interconnects a drain of one of the two transistors of the first unit and a source of the other of the two transistors of the first unit, and the second feedback signal is received by a node that directly interconnects a drain of the other of the two transistors of the first unit and a drain of the transistor of the second unit.

In an example embodiment, a third feedback unit is configured to provide a third feedback signal to the node that directly interconnects the drain of the other of the two transistors of the first unit and the drain of the transistor of the second unit based upon the output signal of the second inverter. When the second feedback unit comprises a PMOS transistor, the third feedback unit comprises an NMOS transistor. When the second feedback unit comprises an NMOS transistor, the third feedback unit comprises a PMOS transistor.

According to example embodiments, a phase interpolator includes a phase mixer and a Schmitt trigger circuit. The phase mixer generates a mixed signal by mixing a first input signal and a second input signal. The Schmitt trigger circuit generates an output signal by clarifying a logical level of the mixed signal. The Schmitt trigger circuit includes a first inverter, a second inverter, a first feedback unit, and a second feedback unit. The first inverter includes a PMOS transistor unit and an NMOS transistor unit which generate an internal signal by inverting the mixed signal based on a first feedback signal and provide the internal signal to a first node. The second inverter generates the output signal by inverting a first signal of the first node. The first feedback unit generates the first feedback signal providing a first hysteresis character to a first unit among the PMOS transistor unit and the NMOS transistor unit based on the first signal of the first node. The second feedback unit generates a second feedback signal providing a second hysteresis character to a second unit among the PMOS transistor unit and the NMOS transistor unit based on the output signal. The second feedback unit provides the second feedback signal to the first node. The second hysteresis character has the same size as the first hysteresis character.

In an example embodiment, the PMOS transistor unit and the NMOS transistor unit may have different current driving power when a supply voltage is low. A ratio of the first feedback signal and the second feedback signal may be controlled according to a ratio of the current driving powers of the PMOS transistor unit and the NMOS transistor unit such that the first hysteresis character and the second hysteresis character have the same size.

In an example embodiment, the Schmitt trigger circuit may generate the output signal having a 50% duty cycle by modifying the mixed signal when the first and second input signals have frequencies greater than hundreds of MHz.

In an example embodiment, the phase mixer may include a third inverter, a fourth inverter, and a capacitor. The third inverter may have an input terminal receiving the first input signal, and an output terminal connected to an output node which the mixed signal is outputted from. The fourth inverter may have an input terminal receiving the second input signal, and an output terminal connected to the output node. The capacitor may have a first terminal connected to the output node, and a second terminal receiving the ground voltage.

In an example embodiment, a mixing ratio of the first input signal and the second input signal in the phase mixer may correspond to a ratio of a current driving power of the third inverter and a current driving power of the fourth inverter.

In an example embodiment, the phase mixer may generate the mixed signal by mixing the first input signal and the second input signal equally when the current driving power of the third inverter and the current driving power of the fourth inverter are the same.

According to example embodiments, a non-volatile memory device includes a memory cell array, a control circuit, a voltage generator, an address decoder, and a data input/output circuit. The memory cell array includes including a plurality of memory cells connected to a plurality of word lines. The control circuit includes a duty cycle correction circuit configured to generate a data strobe signal based on a second read clock signal which is changed from a first read clock signal during a reading of data from the memory cells. The control circuit generates a row address signal and a column address signal based on a command signal and an address signal. The voltage generator generates a plurality of reference voltages. The address decoder activates a word line corresponding to the row address signal among the word lines based on the reference voltages. The data input/output circuit receives read data of memory cells connected to the activated word line through a plurality of bit lines based on the column address signal. The data input/output circuit outputs the read data as a data signal based on the data strobe signal. The duty cycle correction circuit includes a delay unit, a phase mixer, and a Schmitt trigger circuit. The delay unit generates a delay signal by delaying the second read clock signal. The phase mixer generates a mixed signal by mixing the second read clock signal and the delay signal. The Schmitt trigger circuit generates the data strobe signal by clarifying a logical level of the mixed signal. The Schmitt trigger circuit includes a first inverter, a second inverter, a first feedback circuit, and a second feedback circuit. The first inverter includes a PMOS transistor unit and an NMOS transistor unit which generate an internal signal by inverting the mixed signal based on a first feedback signal and provide the internal signal to a first node. The second inverter generates the data strobe signal by inverting a first signal of the first node. The first feedback unit generates the first feedback signal providing a first hysteresis character to a first unit among the PMOS transistor unit and the NMOS transistor unit based on the first signal of the first node. The second feedback unit generates a second feedback signal providing a second hysteresis character to a second unit among the PMOS transistor unit and the NMOS transistor unit based on the data strobe signal. The second feedback unit provides the second feedback signal to the first node. The second hysteresis character has the same size as the first hysteresis character.

In an example embodiment, the duty cycle correction circuit may generate the data strobe signal having a 50% duty cycle by modifying the second read clock signal when the first and second read clock signals have frequencies greater than hundreds of MHz.

As described above, the Schmitt trigger circuit and the phase interpolator including the same may have a high hysteresis character, even though a voltage level of the supply voltage is reduced, by changing a transistor, which provides a hysteresis character when the input signal is transferred from a logical high level to a logical low level, to an NMOS transistor which is robust to low supply voltage.

BRIEF DESCRIPTION OF THE DRAWINGS

Example embodiments of the disclosure will be more clearly understood from the following detailed description taken in conjunction with the accompanying drawings.

DETAILED DESCRIPTION OF THE EMBODIMENTS

Figure 1:
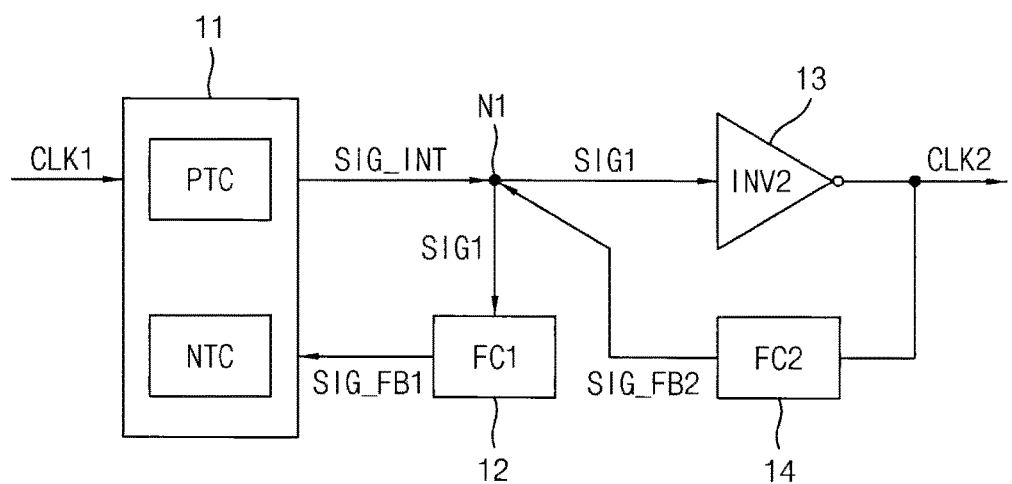
FIG. 1 is a circuit diagram illustrating a Schmitt trigger circuit according to an example embodiment.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a Schmitt trigger circuit according to an example embodiment.

Referring to FIG. 1, a Schmitt trigger circuit 10 includes a first inverter 11, a second inverter INV2 13, a first feedback unit FC1 12, and a second feedback unit FC2 14. The first inverter 11 includes a PMOS transistor unit PTC and an NMOS transistor unit NTC which generate an internal signal SIG_INT by inverting an input signal CLK1 based on a first feedback signal SIG_FB1 and provide the internal signal SIG_INT to a first node N1. The second inverter 13 generates an output signal CLK2 by inverting a first signal SIG1 of the first node N1. The first feedback unit 12 generates the first feedback signal SIG_FB1 providing a first hysteresis character to a first unit among the PMOS transistor unit PTC and the NMOS transistor unit NTC based on the first signal SIG1 of the first node N1. The second feedback unit 14 generates a second feedback signal SIG_FB2 providing a second hysteresis character to a second unit among the PMOS transistor unit PTC and the NMOS transistor unit NTC based on the output signal CLK2. The second feedback unit 14 provides the second feedback signal SIG_FB2 to the first node N1. The second hysteresis character has the same size as the first hysteresis character.

The PMOS transistor unit PTC and the NMOS transistor unit NTC may have different current driving power when a supply voltage VDD is low. A ratio of the first feedback signal SIG_FB1 and the second feedback signal SIG_FB2 may be controlled according to a ratio of the current driving powers of the PMOS transistor unit PTC and the NMOS transistor unit NTC such that the first hysteresis character and the second hysteresis character have the same size.

Figure 2:
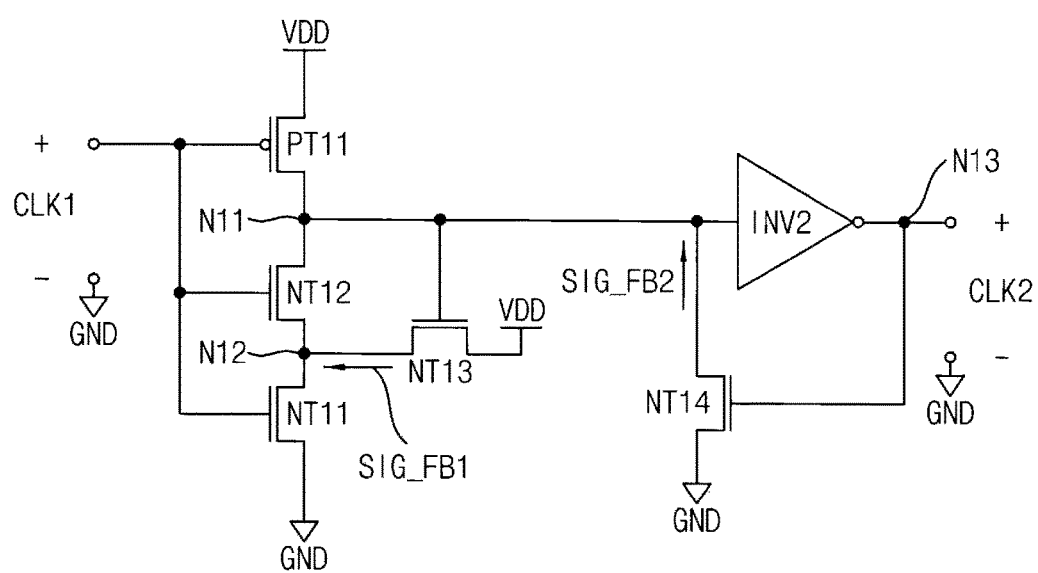
FIG. 2 is a circuit diagram illustrating a Schmitt trigger circuit according to another example embodiment.

FIG. 2 is a circuit diagram illustrating a Schmitt trigger circuit according to another example embodiment. FIG. 2 shows a case that the first unit is the NMOS transistor unit NTC and the second unit is the PMOS transistor unit PTC in FIG. 1.

Referring to FIG. 2, a Schmitt trigger circuit 100 includes a first PMOS transistor PT11, an inverter INV2, a first NMOS transistor NT11, a second NMOS transistor NT12, a third NMOS transistor NT13, and a fourth NMOS transistor NT14.

Comparing FIG. 1 and FIG. 2, the PMOS transistor unit PTC includes the first PMOS transistor PT11, the NMOS transistor unit NTC includes the first and second NMOS transistors NT11 and NT12, the first feedback unit 12 includes the third NMOS transistor NT13, and the second feedback unit 14 includes the fourth NMOS transistor NT14.

The first PMOS transistor PT11 may have a gate terminal receiving the input signal CLK1, a source terminal receiving the supply voltage VDD, and a drain terminal connected to the first node N11. The first NMOS transistor NT11 may have a gate terminal receiving the input signal CLK1, a drain terminal connected to a second node N12, and a source terminal receiving a ground voltage GND. The second NMOS transistor NT12 may have a gate terminal receiving the input signal CLK1, a drain terminal connected to the first node N11, and a source terminal connected to the second node N12. The third NMOS transistor NT13 may have a gate terminal connected to the first node N11, a drain terminal receiving the supply voltage VDD, and a source terminal connected the second node N12. The inverter INV2 may have an input terminal connected to the first node N11, and an output terminal connected to a third node N13. The output signal CLK2 may be outputted from the third node N13. The fourth NMOS transistor NT14 may have a gate terminal connected to the third node N13, a drain terminal connected to the first node N11, and a source terminal receiving the ground voltage GND. The third NMOS transistor NT13 may provide the first feedback signal SIG_FB1 to the second node N12. The fourth NMOS transistor NT14 may provide the second feedback signal SIG_FB2 to the first node N11.

The output signal CLK2 maintains a logical low level when the input signal CLK1 is transferred from a logical low level to a logical high level. At this time, the logical high level corresponds to the supply voltage VDD, and the logical low level corresponds to the ground voltage GND. When the voltage level of the input signal CLK1 increases and exceeds the threshold voltage VthNT11 of the first NMOS transistor NT11, the first NMOS transistor NT11 is turned-on, the third NMOS transistor NT13 is turned-on, and the third NMOS transistor NT13 provides the first feedback signal SIG_FB1 to the second node N12. If a turn-on resistance of the first NMOS transistor NT11 is RN1 and a turn-on resistance of the third NMOS transistor NT13 is RN3, the voltage level of the second node N12 becomes VDD*(RN1/(RN1+RN3)). To turn-on the second NMOS transistor NT12, the first trigger voltage VTRIGHIGH, VDD*(RN1/(RN1+RN3))+VthNT12 should be provided to the gate terminal of the second NMOS transistor NT12. The first trigger voltage VTRIGHIGH may be calculated by adding the voltage level of the second node N12 and a threshold voltage VthNT12 of the second NMOS transistor NT12. When voltage level of the input signal CLK1 exceeds the first trigger voltage VTRIGHIGH, the voltage level of the output signal CLK2 is transferred to logical high level. If the first trigger voltage VTRIGHIGH becomes higher, the Schmitt trigger circuit 100 may have a higher hysteresis character when the input signal CLK1 is transferred from the logical low level to the logical high level.

The output signal CLK2 maintains the logical high level when the input signal CLK1 is transferred from the logical high level to the logical low level. When the voltage level of the input signal CLK1 decreases and becomes lower than the threshold voltage VthPT11 of the first PMOS transistor PT11, the first PMOS transistor PT11 drives the first node N11 as the supply voltage VDD and the fourth NMOS transistor NT14, which is turned-on by the output signal CLK2, drives the first node N11 as the ground voltage GND through the second feedback signal SIG_FB2. If the first PMOS transistor PT11's power to drive the first node N11 as the supply voltage VDD is equal to the fourth NMOS transistor NT14's power to drive the first node N11 as the ground voltage GND when voltage level of the input signal CLK1 is the second trigger voltage VTRIGLOW, the first node N11 is driven as the ground voltage GND when voltage level of the input signal CLK1 becomes equal to or larger than the second trigger voltage VTRIGLOW and the first node N11 is driven as the supply voltage VDD when voltage level of the input signal CLK1 becomes less than the second trigger voltage VTRIGLOW. If the second trigger voltage VTRIGLOW becomes lower, the Schmitt trigger circuit 100 may have higher a hysteresis character when the input signal CLK1 is transferred from the logical high level to the logical low level. At low supply voltage LVDD, the driving power of the first PMOS transistor PT11 becomes lower than the driving power of the fourth NMOS transistor NT14, and the second trigger voltage VTRIGLOW decreases. If voltage level of the input signal CLK1 fluctuates between the supply voltage VDD to the lowered second trigger voltage VTRIGLOW, the output signal CLK2 is maintained as the supply voltage VDD. As a result, the Schmitt trigger circuit 100 has high a hysteresis character when the input signal CLK1 is transferred from the logical high level to the logical low level at low supply voltage LVDD.

For example, when the supply voltage VDD is low, the Schmitt trigger circuit 100 of FIG. 2 may have an improved hysteresis character compared to a case of using stacked PMOS transistors and stacked NMOS transistors. When the supply voltage VDD is low, the PMOS transistor and NMOS transistor may have different threshold voltages or different current driving powers. If the threshold voltage and current driving power are changed considerably when PMOS transistors are stacked, the hysteresis character of the PMOS transistor and hysteresis character of the NMOS transistor may become different from each other.

Thus, the Schmitt trigger circuit 100 may have a changed hysteresis character by the stacked NMOS transistors NT11 and NT12, the third NMOS transistor NT13, the unstacked first PMOS transistor PT11, and the fourth NMOS transistor NT14. Also, the third NMOS transistor NT13 and the fourth NMOS transistor NT14 may control a ratio of the first feedback signal SIG_FB1 and the second feedback signal SIG_FB2 according to a ratio of current driving powers of the first PMOS transistor PT11 and the NMOS transistors NT11 and NT12, respectively, such that the Schmitt trigger circuit 100 may have a balanced hysteresis character.

The first feedback signal SIG_FB1 may be determined by a channel width/length (W/L) ratio of the third NMOS transistor NT13 and the second feedback signal SIG_FB2 may be determined by a W/L ratio of the fourth NMOS transistor NT14.

Current driving power of the NMOS transistors NT11, NT12 and current driving power of the first PMOS transistor PT11 may be changed by process and temperature variations other than a supply voltage level variation.

Figure 3:
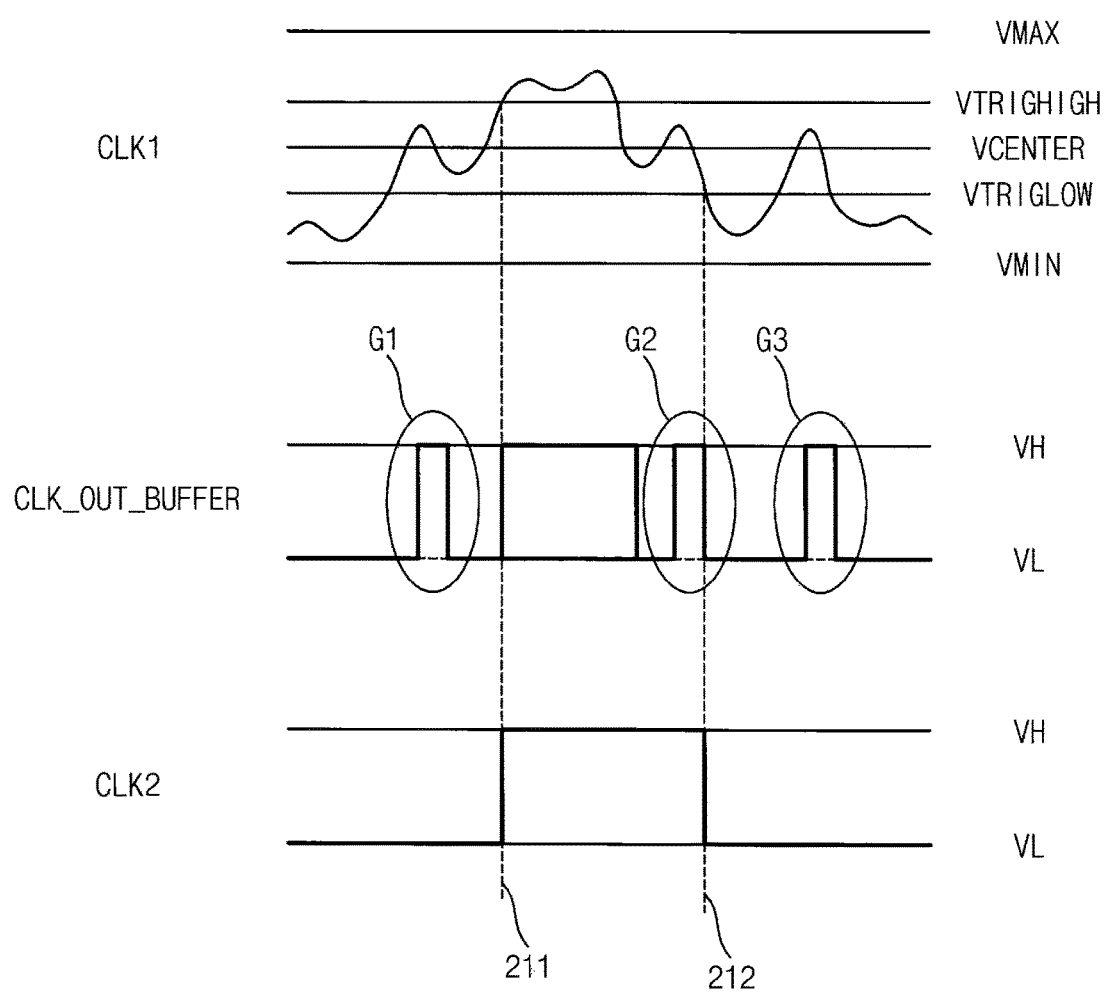
FIG. 3 is a graph illustrating operation of the Schmitt trigger circuit of FIG. 2.

FIG. 3 is a graph illustrating an operation of the Schmitt trigger circuit of FIG. 2.

Referring to FIG. 3, the Schmitt trigger circuit 100 may change the voltage level of the output signal CLK2 from logical low level VL to logical high level VH at a time point 211 when the voltage level of the output signal CLK2 is logical low level VL and the voltage level of the input signal CLK1 increases through the first trigger voltage VTRIGHIGH.

The Schmitt trigger circuit 100 may change voltage level of the output signal CLK2 from logical high level VH to logical low level VL at a time point 212 when voltage level of the output signal CLK2 is logical high level VH and voltage level of the input signal CLK1 decreases through the second trigger voltage VTRIGLOW.

When a normal buffer, different from the Schmitt trigger circuit 100, receives the input signal CLK1, the output signal CLK_OUT BUFFER of the normal buffer includes unexpected glitches G1, G2, and G3.

Figure 4:
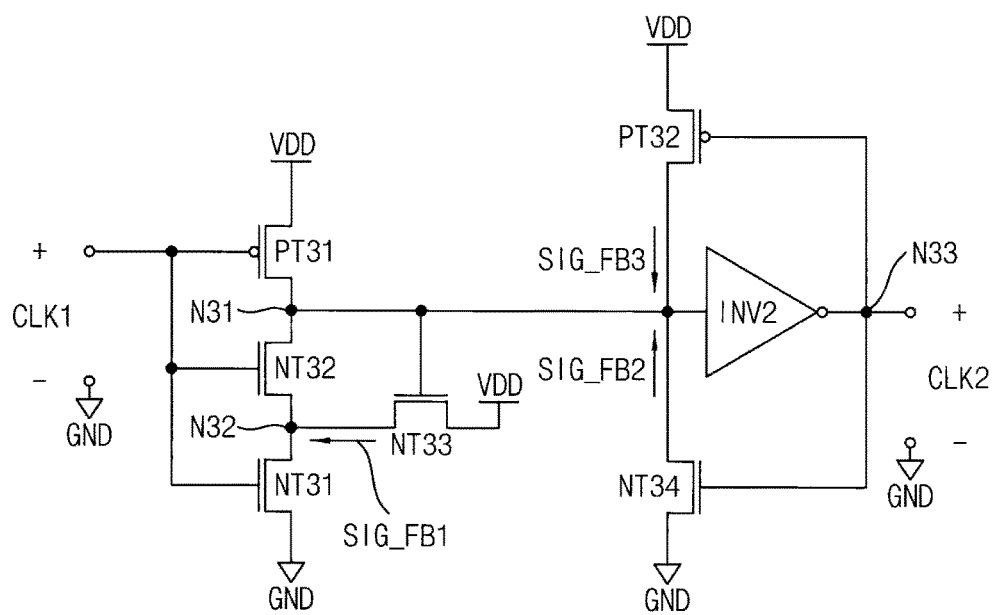
FIGS. 4, 5, and 6 are circuit diagrams illustrating Schmitt trigger circuits according to example embodiments.
Figure 5:
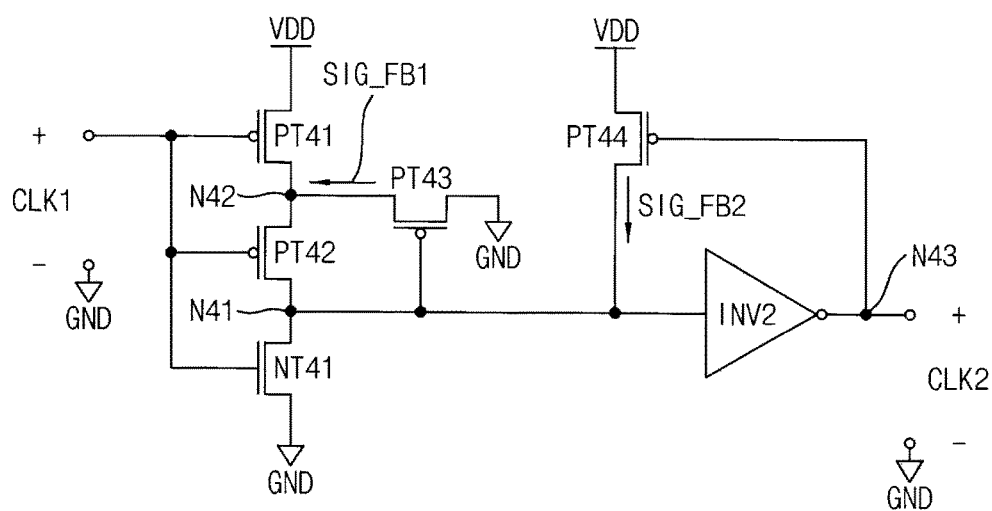
Figure 6:
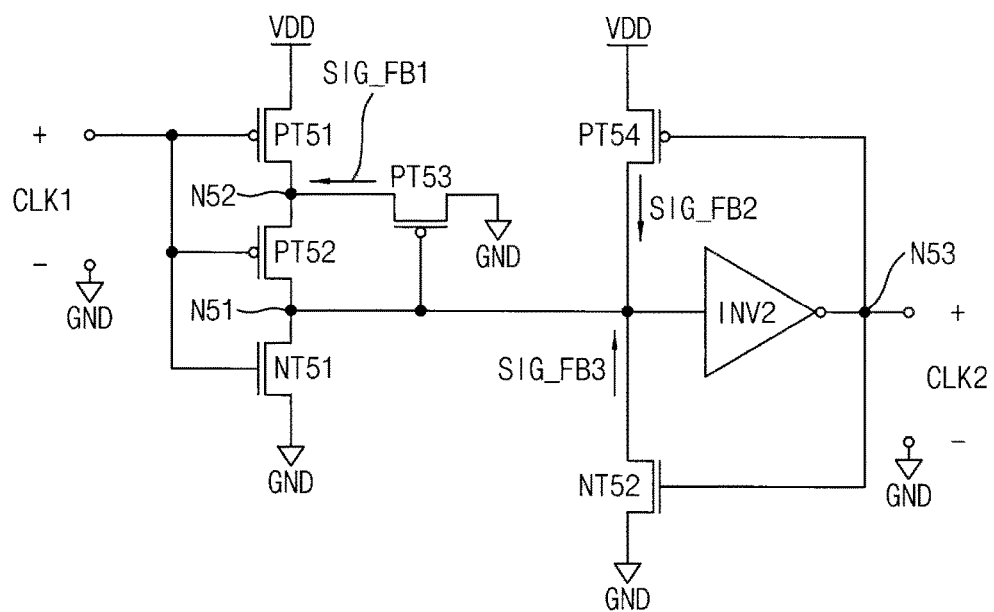

FIGS. 4, 5, and 6 are circuit diagrams illustrating Schmitt trigger circuits according to example embodiments.

Referring to FIG. 4, a Schmitt trigger circuit 300 includes a first PMOS transistor PT31, a second PMOS transistor PT32, an inverter INV2, a first NMOS transistor NT31, a second NMOS transistor NT32, a third NMOS transistor NT33, and a fourth NMOS transistor NT34.

Comparing FIG. 1 and FIG. 4, the PMOS transistor unit PTC includes the first PMOS transistor PT31, the NMOS transistor unit NTC includes the first and second NMOS transistors NT31 and NT32, the first feedback unit 12 includes the third NMOS transistor NT33, and the second feedback unit 14 includes the fourth NMOS transistor NT34.

The first PMOS transistor PT31 may have a gate terminal receiving the input signal CLK1, a source terminal receiving the supply voltage VDD, and a drain terminal connected to the first node N31. The first NMOS transistor NT31 may have a gate terminal receiving the input signal CLK1, a drain terminal connected to a second node N32, and a source terminal receiving the ground voltage GND. The second NMOS transistor NT32 may have a gate terminal receiving the input signal CLK1, a drain terminal connected to the first node N31, and a source terminal connected to the second node N32. The third NMOS transistor NT33 may have a gate terminal connected to the first node N31, a drain terminal receiving the supply voltage VDD, and a source terminal connected the second node N32. The inverter INV2 may have an input terminal connected to the first node N31, and an output terminal connected to a third node N33. The output signal CLK2 may be outputted from the third node N33. The fourth NMOS transistor NT34 may have a gate terminal connected to the third node N33, a drain terminal connected to the first node N31, and a source terminal receiving the ground voltage GND. The second PMOS transistor PT32 may have a gate terminal connected to the third node N33, a source terminal receiving the supply voltage VDD, and a drain terminal connected to the first node N31. The third NMOS transistor NT33 may provide the first feedback signal SIG_FB1 to the second node N32. The fourth NMOS transistor NT34 may provide the second feedback signal SIG_FB2 to the first node N31. The second PMOS transistor PT32 may provide the third feedback signal SIG_FB3 to the first node N31.

Because the second PMOS transistor PT32 drives the first node N31 as the supply voltage VDD through the third feedback signal SIG_FB3 based on the output signal CLK2, which has logical low level, when the input signal CLK1 is transferred from the logical low level to logical high level, the hysteresis character of the Schmitt trigger circuit 300 may be improved. When the voltage level of the input signal CLK1 exceeds the first trigger voltage VTRIGHIGH, the second NMOS transistor NT32 is turned-on and the second NMOS transistor NT32 drives the first node N31 as the ground voltage GND. If the second PMOS transistor PT32's power to drive the first node N31 as the supply voltage VDD is equal to the second NMOS transistor NT32's power to drive the first node N31 as the ground voltage GND, when voltage level of the input signal CLK1 is a third trigger voltage higher than the first trigger voltage VTRIGHIGH, the first node N31 is driven as the ground voltage GND when the voltage level of the input signal CLK1 becomes equal to or larger than the third trigger voltage and the first node N31 is driven as the supply voltage VDD when the voltage level of the input signal CLK1 becomes less than the third trigger voltage. Because the third trigger voltage of the Schmitt trigger circuit 300 is higher than the first trigger voltage VTRIGHIGH of the Schmitt trigger circuit 100, the Schmitt trigger circuit 300's hysteresis character when the input signal CLK1 is transferred from the logical low level to the logical high level may be larger than the Schmitt trigger circuit 100's hysteresis character when the input signal CLK1 is transferred from the logical low level to logical high level.

For example, when the supply voltage VDD is low, the Schmitt trigger circuit 300 of FIG. 4 may have an improved hysteresis character compared to a case of using stacked PMOS transistors and stacked NMOS transistors. When the supply voltage VDD is low, the PMOS transistor and NMOS transistor may have different threshold voltages or different current driving powers. If the threshold voltage and current driving power are changed considerably when PMOS transistors are stacked, the hysteresis character of the PMOS transistor and hysteresis character of the NMOS transistor may become different from each other.

Thus, the Schmitt trigger circuit 300 may have a changed hysteresis character by stacked NMOS transistors NT31 and NT32, the third NMOS transistor NT33, the unstacked first PMOS transistor PT31, and the fourth NMOS transistor NT34. Also, the third NMOS transistor NT33 and the fourth NMOS transistor NT34 may control a ratio of the first feedback signal SIG_FB1 and the second feedback signal SIG_FB2 according to a ratio of current driving powers of the first PMOS transistor PT31 and the NMOS transistors NT31 and NT32 respectively such that the Schmitt trigger circuit 300 may have a balanced hysteresis character.

In an example embodiment, if a hysteresis character, which the third NMOS transistor NT33 provides to the NMOS transistors NT31 and NT32, is less than a hysteresis character, which the fourth NMOS transistor NT34 provides to the first PMOS transistor PT31, the second PMOS transistor PT32 may provide additional hysteresis character to the NMOS transistors NT31 and NT32 through the third feedback signal SIG_FB3 such that the hysteresis character of the first PMOS transistor PT31 and the hysteresis character of the NMOS transistors NT31 and NT32 may be set equally.

The third feedback signal SIG_FB3 may be determined by a W/L ratio of the second PMOS transistor PT32.

Referring to FIG. 5, a Schmitt trigger circuit 400 includes a first PMOS transistor PT41, a second PMOS transistor PT42, a third PMOS transistor PT43, a fourth PMOS transistor PT44, a first NMOS transistor NT41, and an inverter INV2.

Comparing FIG. 1 and FIG. 5, the PMOS transistor unit PTC includes the first and second PMOS transistors PT41 and PT42, the NMOS transistor unit NTC includes the first NMOS transistor NT41, the first feedback unit 12 includes the third PMOS transistor PT43, and the second feedback unit 14 includes the fourth PMOS transistor PT44.

The first PMOS transistor PT41 may have a gate terminal receiving the input signal CLK1, a source terminal receiving the supply voltage VDD, and a drain terminal connected to a second node N42. The second PMOS transistor PT42 may have a gate terminal receiving the input signal CLK1, a source terminal connected to the second node N42, and a drain terminal connected to the first node N41. The third PMOS transistor PT43 may have a gate terminal connected to the first node N41, a source terminal connected to the second node N42, and a drain terminal receiving the ground voltage GND. The first NMOS transistor NT41 may have a gate terminal receiving the input signal CLK1, a drain terminal connected to the first node N41, and a source terminal receiving the ground voltage GND. The inverter INV2 may have an input terminal connected to the first node N41 and an output terminal connected to the third node N43. The output signal CLK2 may be outputted from the third node N43. The fourth PMOS transistor PT44 may have a gate terminal connected to the third node N43, a source terminal receiving the supply voltage VDD, and a drain terminal connected to the first node N41. The third PMOS transistor PT43 may provide the first feedback signal SIG_FB1 to the second node N42. The fourth PMOS transistor PT44 may provide the second feedback signal SIG_FB2 to the first node N41.

The output signal CLK2 maintains the logical low level when the input signal CLK1 is transferred from the logical low level to logical high level. When the voltage level of the input signal CLK1 increases and exceeds the threshold voltage VthNT41 of the first NMOS transistor NT41, the first NMOS transistor NT41 drives the first node N41 as the ground voltage GND, and the fourth PMOS transistor PT44, which is turned-on by the output signal CLK2, drives the first node N41 as the supply voltage VDD through the second feedback signal SIG_FB2. If the first NMOS transistor NT41's power to drive the first node N41 as the ground voltage GND is equal to the fourth PMOS transistor PT44's power to drive the first node N41 as the supply voltage VDD when the voltage level of the input signal CLK1 is the first trigger voltage VTRIGHIGH, the first node N41 is driven as the ground voltage GND when the voltage level of the input signal CLK1 becomes equal to or larger than the first trigger voltage VTRIGHIGH, and the first node N41 is driven as the supply voltage VDD when voltage level of the input signal CLK1 becomes less than the first trigger voltage VTRIGHIGH. If the first trigger voltage VTRIGHIGH becomes higher, the Schmitt trigger circuit 400 may have a higher hysteresis character when the input signal CLK1 is transferred from the logical low level to logical high level.

The output signal CLK2 maintains the logical high level when the input signal CLK1 is transferred from the logical high level to logical low level. At this time, the logical high level corresponds to the supply voltage VDD, and the logical low level corresponds to the ground voltage GND. When the voltage level of the input signal CLK1 decreases and becomes lower than a voltage generated by subtracting the threshold voltage VthPT41 of the first PMOS transistor PT41 from the supply voltage VDD, the first PMOS transistor PT41 is turned-on, the third PMOS transistor PT43 is turned-on, and the third PMOS transistor PT43 provides the first feedback signal SIG_FB1 to the second node N42. If a turn-on resistance of the first PMOS transistor PT41 is RP1 and a turn-on resistance of the third PMOS transistor PT43 is RP3, the voltage level of the second node N42 becomes VDD*(RP3/(RP1+RP3)). To turn-on the second PMOS transistor PT42, the second trigger voltage VTRIGLOW, VDD*(RP3/(RP1+RP3))−VthPT42 should be provided to the gate terminal of the second PMOS transistor PT42. The second trigger voltage VTRIGLOW may be calculated by subtracting a threshold voltage VthPT42 of the second PMOS transistor PT42 from the voltage level of the second node N42. When the voltage level of the input signal CLK1 becomes lower than the second trigger voltage VTRIGLOW, the voltage level of the output signal CLK2 is transferred to the logical low level. If the second trigger voltage VTRIGLOW becomes lower, the Schmitt trigger circuit 400 may have a higher hysteresis character when the input signal CLK1 is transferred from the logical high level to logical low level.

If a width of the fourth PMOS transistor PT44 is set to be considerably higher than a width of the first NMOS transistor NT41 at the low supply voltage LVDD, a current driving power of the fourth PMOS transistor PT44 may be set to be larger than a current driving power of the first NMOS transistor NT41, and the first trigger voltage VTRIGHIGH increases. If the voltage level of the input signal CLK1 fluctuates between the ground voltage GND to the increased first trigger voltage VTRIGHIGH, the output signal CLK2 is maintained as the ground voltage GND. As a result, the Schmitt trigger circuit 400 has a high hysteresis character when the input signal CLK1 is transferred from the logical low level to logical high level at low supply voltage LVDD.

For example, when the supply voltage VDD is low, the Schmitt trigger circuit 400 of FIG. 5 may have an improved hysteresis character compared to a case of using stacked PMOS transistors and stacked NMOS transistors. When the supply voltage VDD is low, the PMOS transistor and NMOS transistor may have different threshold voltages or different current driving powers. If the threshold voltage and current driving power are changed considerably when PMOS transistors are stacked, a hysteresis character of the PMOS transistor and hysteresis character of the NMOS transistor may become different each other.

Thus, the Schmitt trigger circuit 400 may have a changed hysteresis character by stacked PMOS transistors PT41 and PT42, the third PMOS transistor PT43, the unstacked first NMOS transistor NT41, and the fourth PMOS transistor PT44. Also, the third PMOS transistor PT43 and the fourth PMOS transistor PT44 may control a ratio of the first feedback signal SIG_FB1 and the second feedback signal SIG_FB2 according to a ratio of current driving powers of the PMOS transistors PT41 and PT42 and the first NMOS transistor NT41, respectively, such that the Schmitt trigger circuit 400 may have a balanced hysteresis character.

The first feedback signal SIG_FB1 may be determined by a W/L ratio of the third PMOS transistor PT43 and the second feedback signal SIG_FB2 may be determined by a W/L ratio of the fourth PMOS transistor PT44.

Referring to FIG. 6, a Schmitt trigger circuit 500 includes a first PMOS transistor PT51, a second PMOS transistor PT52, a third PMOS transistor PT53, a fourth PMOS transistor PT54, a first NMOS transistor NT51, a second NMOS transistor NT52, and an inverter INV2.

Comparing FIG. 1 and FIG. 6, the PMOS transistor unit PTC includes the first and second PMOS transistors PT51 and PT52, the NMOS transistor unit NTC includes the first NMOS transistor NT51, the first feedback unit 12 includes the third PMOS transistor PT53, and the second feedback unit 14 includes the fourth PMOS transistor PT54.

The first PMOS transistor PT51 may have a gate terminal receiving the input signal CLK1, a source terminal receiving the supply voltage VDD, and a drain terminal connected to a second node N52. The second PMOS transistor PT52 may have a gate terminal receiving the input signal CLK1, a source terminal connected to the second node N52, and a drain terminal connected to the first node NM. The third PMOS transistor PT53 may have a gate terminal connected to the first node NM, a source terminal connected to the second node N52, and a drain terminal receiving the ground voltage GND. The first NMOS transistor NT51 may have a gate terminal receiving the input signal CLK1, a drain terminal connected to the first node NM, and a source terminal receiving the ground voltage GND. The inverter INV2 may have an input terminal connected to the first node N51 and an output terminal connected to the third node N53. The output signal CLK2 may be outputted from the third node N53. The fourth PMOS transistor PT54 may have a gate terminal connected to the third node N53, a source terminal receiving the supply voltage VDD, and a drain terminal connected to the first node N51. The second NMOS transistor NT52 may have a gate terminal connected to the third node N53, a drain terminal connected to the first node N51, and a source terminal receiving the ground voltage GND. The third PMOS transistor PT53 may provide the first feedback signal SIG_FB1 to the second node N52. The fourth PMOS transistor PT54 may provide the second feedback signal SIG_FB2 to the first node N51. The second NMOS transistor NT52 may provide the third feedback signal SIG_FB3 to the first node N51.

Because the second NMOS transistor NT52 drives the first node NM as the ground voltage GND through the third feedback signal SIG_FB3 based on the output signal CLK2, which has the logical high level, when the input signal CLK1 is transferred from the logical high level to logical low level, a hysteresis character of the Schmitt trigger circuit 500 may be improved. When the voltage level of the input signal CLK1 becomes lower than the second trigger voltage VTRIGLOW, the second PMOS transistor PT52 is turned-on and the second PMOS transistor PT52 drives the first node N51 as the supply voltage VDD. If the second NMOS transistor NT52's power to drive the first node N51 as the ground voltage GND is equal to the second PMOS transistor PT52's power to drive the first node N51 as the supply voltage VDD when the voltage level of the input signal CLK1 is a third trigger voltage lower than the second trigger voltage VTRIGLOW, the first node N51 is driven as the ground voltage GND when the voltage level of the input signal CLK1 becomes equal to or larger than the third trigger voltage and the first node N51 is driven as the supply voltage VDD when the voltage level of the input signal CLK1 becomes less than the third trigger voltage. Because the third trigger voltage of the Schmitt trigger circuit 500 is lower than the second trigger voltage VTRIGLOW of the Schmitt trigger circuit 400, the Schmitt trigger circuit 500's hysteresis character when the input signal CLK1 is transferred from the logical high level to logical low level may be larger than the Schmitt trigger circuit 400's hysteresis character when the input signal CLK1 is transferred from the logical high level to logical low level.

For example, when the supply voltage VDD is low, the Schmitt trigger circuit 500 of FIG. 6 may have an improved hysteresis character compared to a case of using stacked PMOS transistors and stacked NMOS transistors. When the supply voltage VDD is low, the PMOS transistor and NMOS transistor may have different threshold voltages or different current driving powers. If the threshold voltage and current driving power are changed considerably when PMOS transistors are stacked, a hysteresis character of the PMOS transistor and a hysteresis character of the NMOS transistor may become different from each other.

Thus, the Schmitt trigger circuit 500 may have a changed hysteresis character by stacked PMOS transistors PT51 and PT52, the third PMOS transistor PT53, the unstacked first NMOS transistor NT51, and the fourth PMOS transistor PT54. Also, the third PMOS transistor PT53 and the fourth PMOS transistor PT54 may control a ratio of the first feedback signal SIG_FB1 and the second feedback signal SIG_FB2 according to a ratio of current driving powers of the PMOS transistors PT51 and PT52 and the first NMOS transistor NT51, respectively, such that the Schmitt trigger circuit 500 may have a balanced hysteresis character.

In an example embodiment, if a hysteresis character, which the third PMOS transistor PT53 provides to the PMOS transistors PT51 and PT52, is less than a hysteresis character, which the fourth PMOS transistor PT54 provides to the first NMOS transistor NT51, the second NMOS transistor NT52 may provide an additional hysteresis character to the PMOS transistors PT51 and PT52 through the third feedback signal SIG_FB3 such that a hysteresis character of the PMOS transistors PT51 and PT52 and a hysteresis character of the first NMOS transistor NT51 may be set equally.

The third feedback signal SIG_FB3 may be determined by a W/L ratio of the second NMOS transistor NT52.

Figure 7:
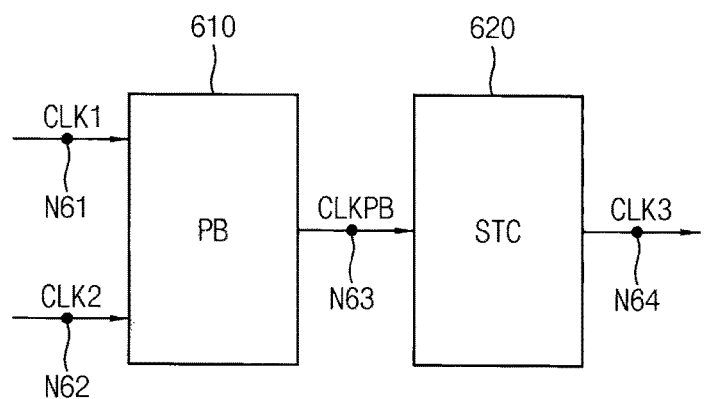
FIG. 7 is a block diagram illustrating a phase interpolator according to an example embodiment.

FIG. 7 is a block diagram illustrating a phase interpolator according to an example embodiment.

Referring to FIG. 7, a phase interpolator 600 includes a phase mixer PB 610 and a Schmitt trigger circuit STC 620.

The phase mixer 610 generates a mixed signal CLKPB by mixing a first input signal CLK1 and a second input signal CLK2. The second input signal CLK2 may be an inverted signal of the delayed first input signal CLK1. The Schmitt trigger circuit 620 generates an output signal CLK3 by clarifying the logical level of the mixed signal CLKPB.

The Schmitt trigger circuit 620 may be embodied with one of the Schmitt trigger circuits 10, 100, 300, 400, and 500 of FIGS. 1, 2, 4, 5, and 6. The Schmitt trigger circuit 620 may be understood based on the references of the Schmitt trigger circuits 10, 100, 300, 400, and 500 of FIGS. 1, 2, 4, 5, and 6. The phase mixer 610 will be described with the reference to FIGS. 8 and 9.

Figure 8:
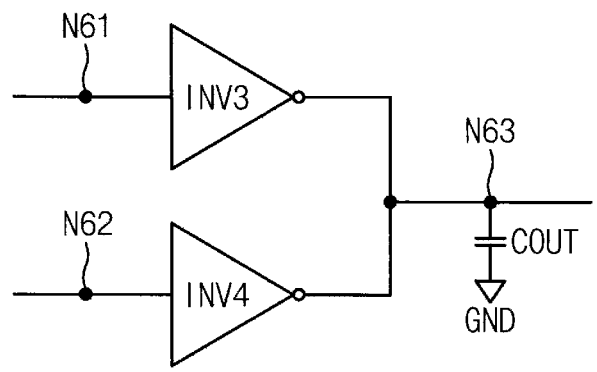
FIG. 8 is a circuit diagram illustrating a phase mixer included in the phase interpolator of FIG. 7.

FIG. 8 is a circuit diagram illustrating a phase mixer included in the phase interpolator of FIG. 7.

Referring to FIG. 8, the phase mixer 610 may include a third inverter INV3, a fourth inverter INV4, and a capacitor COUT.

A voltage signal of a first node N61 is the first input signal CLK1. A voltage signal of a second node N62 is the second input signal CLK2. A voltage signal of a third node N63 is the mixed signal CLKPB.

The third inverter INV3 may have an input terminal connected to the first node N61, and an output terminal connected to the third node N63. The fourth inverter INV4 may have an input terminal connected to the second node N62, and an output terminal connected to the third node N63. The capacitor COUT may have a first terminal connected to the third node N63, and a second terminal receiving the ground voltage GND. In an example embodiment, the capacitor COUT may be a parasitic capacitor of a circuit. In another example embodiment, the capacitor COUT may be a designed capacitor of a circuit.

The third inverter INV3 may charge or discharge the capacitor COUT by driving the first input signal CLK1. The fourth inverter INV4 may charge or discharge the capacitor COUT by driving the second input signal CLK2.

A mixing ratio of the first input signal CLK1 and the second input signal CLK2 in the phase mixer 610 may correspond to a ratio of a current driving power of the third inverter INV3 and a current driving power of the fourth inverter INV4. The phase mixer 610 may generate the mixed signal CLKPB by mixing the first input signal CLK1 and the second input signal CLK2 equally when the current driving power of the third inverter INV3 and the current driving power of the fourth inverter INV4 are the same.

Figure 9:
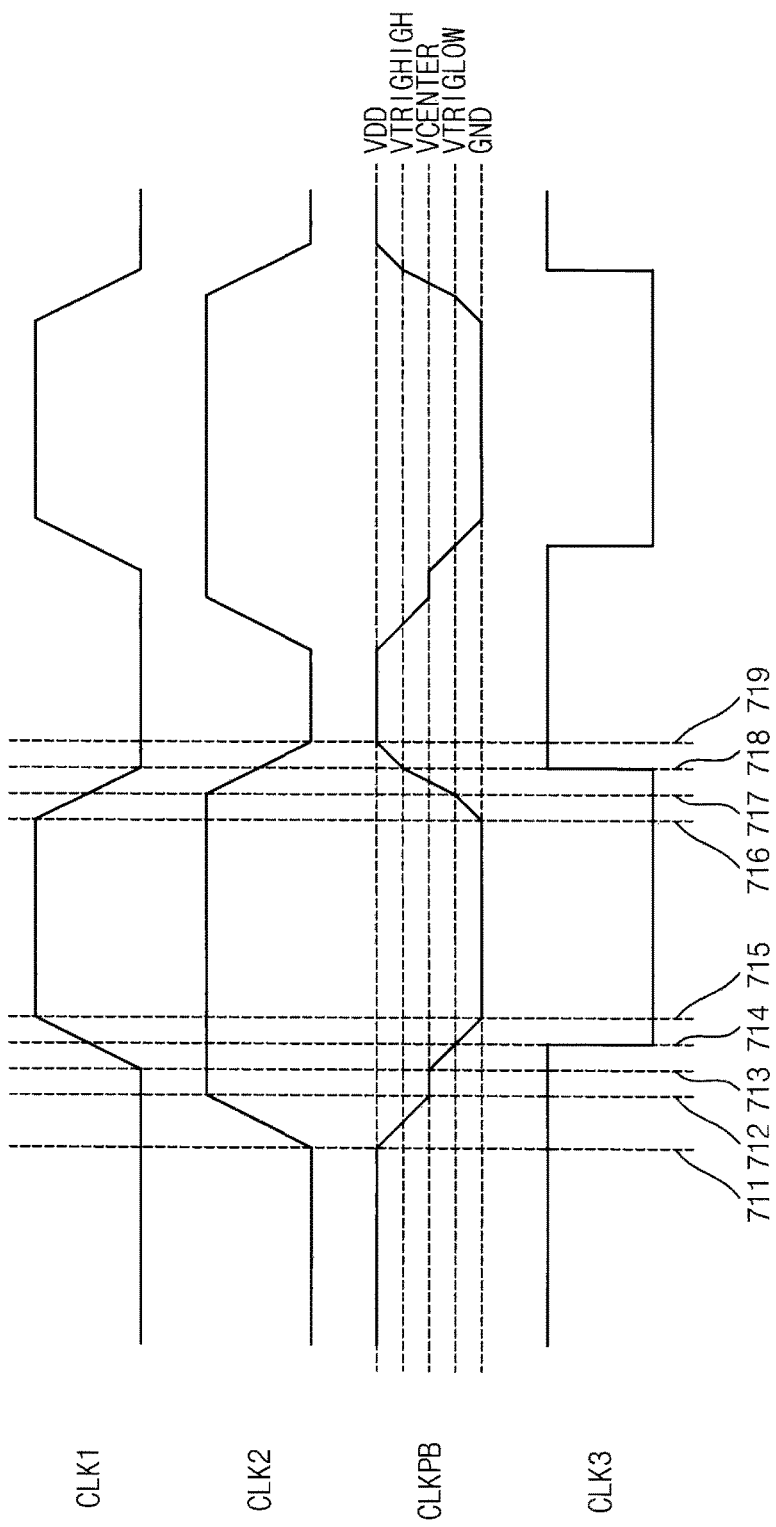
FIG. 9 is a timing diagram illustrating operation of the phase mixer of FIG. 8.

FIG. 9 is a timing diagram illustrating an operation of the phase mixer of FIG. 8. FIG. 8 shows a case that a current driving power of the third inverter INV3 is the same as a current driving power of the fourth inverter INV4.

Referring to FIG. 9, the phase mixer 610 generates the mixed signal CLKPB by mixing the first input signal CLK1 and the second input signal CLK2.

The first input signal CLK1 is transferred from the ground voltage GND to the supply voltage VDD with the first transfer speed between the third time point 713 and the fifth time point 715, and the first input signal CLK1 is transferred from the supply voltage VDD to the ground voltage GND with the first transfer speed between the sixth time point 716 and the eighth time point 718. The second input signal CLK2 is transferred from the ground voltage GND to the supply voltage VDD with the first transfer speed between the first time point 711 to the second time point 712, and the second input signal CLK2 is transferred from the supply voltage VDD to the ground voltage GND with the first transfer speed between the seventh time point 717 and the ninth time point 719.

From the first time point 711 to the second time point 712, the third inverter INV3 drives the third node N63 with the supply voltage VDD in response to the first input signal CLK1 having the ground voltage GND, and the fourth inverter INV4 drives the third node N63 as an inverted signal of the second input signal CLK2, which is transferred from the ground voltage GND to the supply voltage VDD. From the first time point 711 to the second time point 712, the mixed signal CLKPB is transferred from the supply voltage VDD to the center voltage VCENTER of the supply voltage VDD and the ground voltage GND with the second transfer speed, which is half of the first transfer speed.

From the second time point 712 to the third time point 713, the third inverter INV3 drives the third node N63 with the supply voltage VDD in response to the first input signal CLK1 having the ground voltage GND, and the fourth inverter INV4 drives the third node N63 with the ground voltage GND in response to the second input signal CLK2 having the supply voltage VDD. From the second time point 712 to the third time point 713, the mixed signal CLKPB has the center voltage VCENTER.

From the third time point 713 to the fifth time point 715, the third inverter INV3 drives the third node N63 as an inverted signal of the first input signal CLK1, which is transferred from the ground voltage GND to the supply voltage VDD, and the fourth inverter INV4 drives the third node N63 with the ground voltage GND in response to the second input signal CLK2 having the supply voltage VDD. From the third time point 713 to the fifth time point 715, the mixed signal CLKPB is transferred from the center voltage VCENTER to the ground voltage GND with the second transfer speed. Because the second trigger voltage VTRIGLOW of the second Schmitt trigger circuit 620 is lower than the center voltage VCENTER generally, the output signal CLK3 is transferred from the logical high level to logical low level at the fourth time point 714 when voltage level of the mixed signal CLKPB becomes equal to the second trigger voltage VTRIGLOW.

From the sixth time point 716 to the seventh time point 717, the third inverter INV3 drives the third node N63 as an inverted signal of the first input signal CLK1, which is transferred from the supply voltage VDD to the ground voltage GND, and the fourth inverter INV4 drives the third node N63 with the ground voltage GND in response to the second input signal CLK2 having the supply voltage VDD. From the sixth time point 716 to the seventh time point 717, the mixed signal CLKPB is transferred from the ground voltage GND to the supply voltage VDD with the second transfer speed.

From the seventh time point 717 to the eighth time point 718, the third inverter INV3 drives the third node N63 as an inverted signal of the first input signal CLK1, which is transferred from the supply voltage VDD to the ground voltage GND, and the fourth inverter INV4 drives the third node N63 as an inverted signal of the second input signal CLK2, which is transferred from the supply voltage VDD to the ground voltage GND. From the seventh time point 717 to the eighth time point 718, the mixed signal CLKPB is transferred to the supply voltage VDD with the first transfer speed.

From the eighth time point 718 to the ninth time point 719, the third inverter INV3 drives the third node N63 with the supply voltage VDD in response to the first input signal CLK1 having the ground voltage GND, and the fourth inverter INV4 drives the third node N63 as an inverted signal of the second input signal CLK2, which is transferred from the supply voltage VDD to the ground voltage GND. From the eighth time point 718 to the ninth time point 719, the mixed signal CLKPB is transferred to the supply voltage VDDD with the second transfer speed. Because the first trigger voltage VTRIGHIGH of the second Schmitt trigger circuit 620 is higher than the center voltage VCENTER generally, the output signal CLK3 is transferred from the logical low level to logical high level at the eighth time point 718 when the voltage level of the mixed signal CLKPB becomes equal to the first trigger voltage VTRIGHIGH.

Remaining of FIG. 9 may be understood based on the description.

Figure 10:
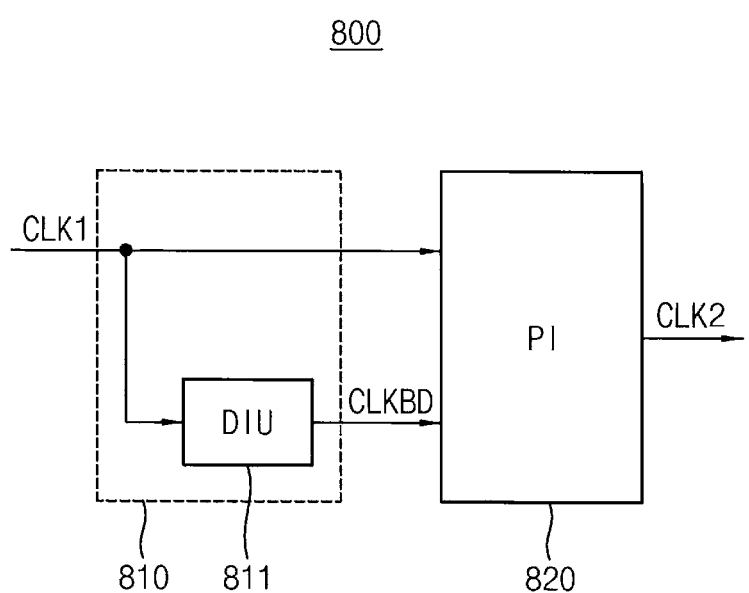
FIG. 10 is a block diagram illustrating a duty cycle correction circuit including the phase interpolator of FIG. 7.

FIG. 10 is a block diagram illustrating a duty cycle correction circuit including the phase interpolator of FIG. 7.

Referring to FIG. 10, a duty cycle correction circuit 800 may include an edge detector 810 and a phase interpolator PI 820. The edge detector 810 may include a delay inversion unit DIU 811.

The edge detector 810 bypasses the input signal CLK1 to the phase interpolator 820. The delay inversion unit 811 generates delay input signal by delaying the input signal CLK1 for an interval when the input signal CLK1 has logical high level in a period of the input signal CLK1. The delay inversion unit 811 generates the inverted delay input signal CLKBD by inverting the delay input signal.

The phase interpolator 820 generates the output signal CLK2 based on the input signal CLK1 and the inverted delay input signal CLKBD. The phase interpolator 820 may have the same or similar structure with the phase interpolator 600 of FIG. 7. The phase interpolator 820 may be understood based on the description about the phase interpolator 600 of FIG. 7.

There is a problem that a duty cycle of the mixed signal is degraded when the phase mixer included in the duty cycle correction circuit 800 receives the input signal CLK1 having high frequency which is equal to or higher than hundreds of MHz. However, the Schmitt trigger circuit included in the duty cycle correction circuit 800 may modify the duty cycle of the degraded mixed signal to be 50%. As a result, even if the duty cycle correction circuit 800 operates at a low supply voltage, the duty cycle correction circuit 800 may provide a superior duty cycle correction function to the input signal CLK1 having high frequency.

Figure 11:
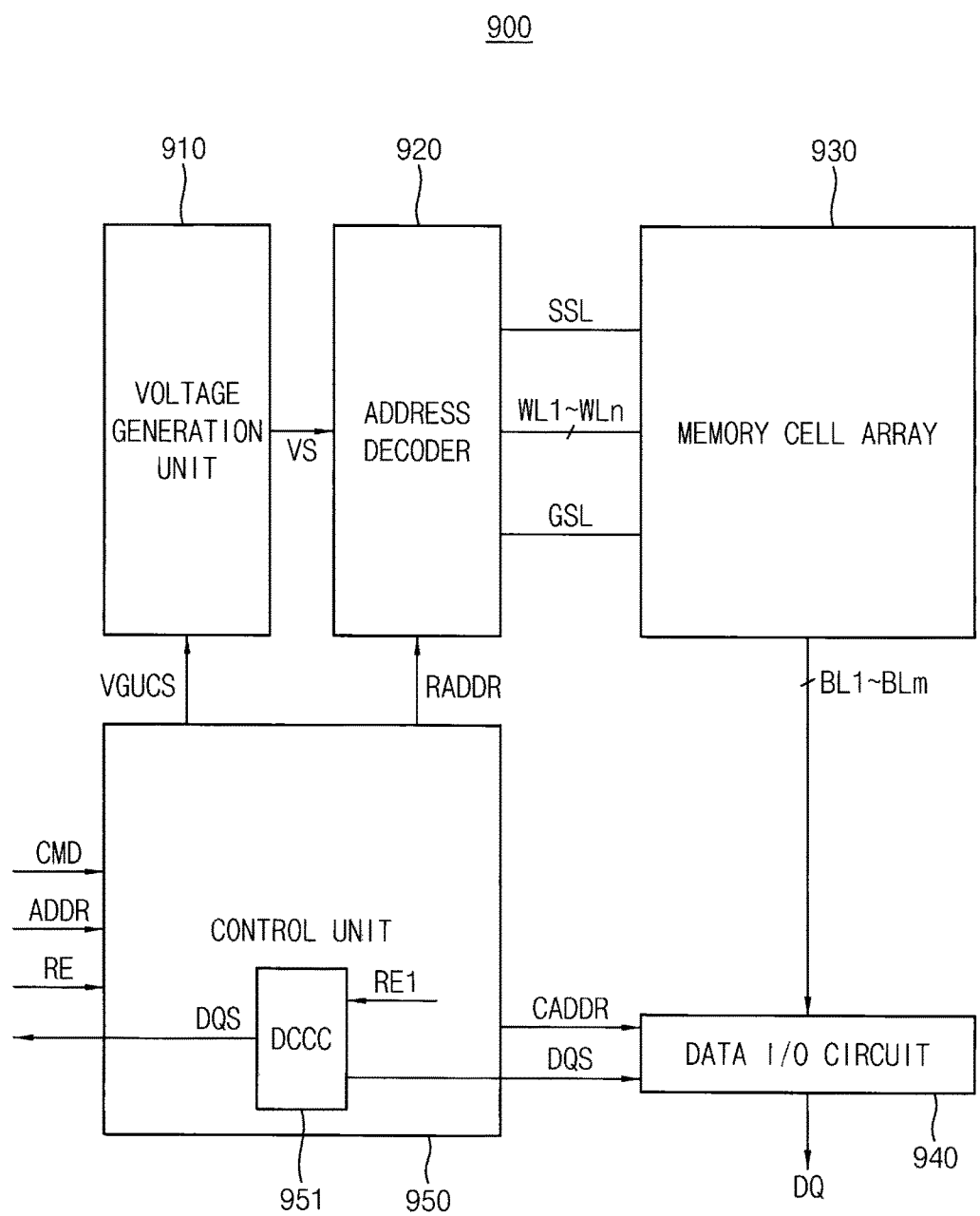
FIG. 11 is a block diagram illustrating a non-volatile memory device according to an example embodiment.

FIG. 11 is a block diagram illustrating a non-volatile memory device according to an example embodiment.

Referring to FIG. 11, a non-volatile memory device 900 includes a memory cell array 930, a control circuit 950, a voltage generator 910, an address decoder 920, and a data input/output circuit 940. The control circuit 950 includes a duty cycle correction circuit DCCC 951.

The memory cell array 930 includes including a plurality of memory cells connected to a plurality of word lines. In an example embodiment, each of the memory cells may be a single level cell storing a data bit. In another example embodiment, each of the memory cells may be a multi level cell storing two data bits. In still another example embodiment, each of the memory cells may be a triple level cell storing three data bits.

The control circuit 950 generates a row address signal RADDR and a column address signal CADDR based on a command signal CMD and an address signal ADDR. The control circuit 950 may output the voltage generator control signal VGUCS which controls the voltage controller 910. The duty cycle correction circuit 951 may generate a data strobe signal DQS based on a second read clock signal RE1 which is changed from a first read clock signal RE during a reading procedure of the non-volatile memory device 900.

The duty cycle correction circuit 951 may be embodied with the duty cycle correction circuit 800 of FIG. 10. Even if the first and second read clock signals RE and RE1 have high frequency which is equal to or higher than hundreds of MHz, the duty cycle correction circuit 951 may have a superior duty cycle correction function, and may generate the data strobe signal DQS having a 50% duty cycle by modifying the second read clock signal RE1. The duty cycle correction circuit 951 may be understood based on the discussion of the duty cycle correction circuit 800 of FIG. 10.

The voltage generator 910 generates a plurality of reference voltages VS based on the voltage generator control signal VGUCS. The address decoder 920 activates a word line corresponding to the row address signal RADDR among the word lines WL1~WLn based on the reference voltages VS. The address decoder further activates a string selection line SSL and a ground selection line GSL based upon the reference voltages VS. The data input/output circuit 940 receives read data of the memory cells connected to the activated word line through a plurality of bit lines BL1~BLm based on the column address signal CADDR. The data input/output circuit 940 outputs the read data as a data signal DQ based on the data strobe signal DQS.

Figure 12:
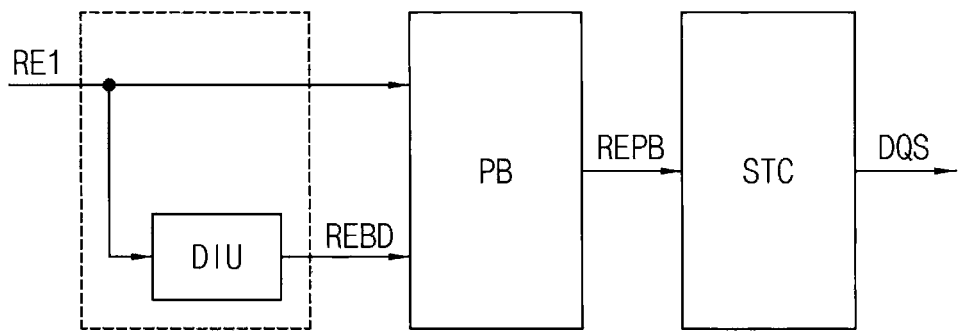
FIG. 12 is a block diagram illustrating a duty cycle correction circuit included in the non-volatile memory device of FIG. 11.

FIG. 12 is a block diagram illustrating a duty cycle correction circuit included in the non-volatile memory device of FIG. 11.

Referring to FIG. 12, the duty cycle correction circuit DCCC includes a delay unit DIU, a phase mixer PB, and a Schmitt trigger circuit STC. The delay unit DIU generates a delayed signal REBD by delaying the second read clock signal RE1. The phase mixer PB generates a mixed signal REPB by mixing the second read clock signal RE1 and the delayed signal REBD. The Schmitt trigger circuit STC generates the data strobe signal DQS by clarifying the logical level of the mixed signal REPB.

The Schmitt trigger circuit STC may be embodied with one of the Schmitt trigger circuits 10, 100, 300, 400, and 500 of FIGS. 1, 2, and 4 through 6. The phase mixer PB may have the same or a similar structure as the phase mixer 610 of FIG. 8.

Figure 13:
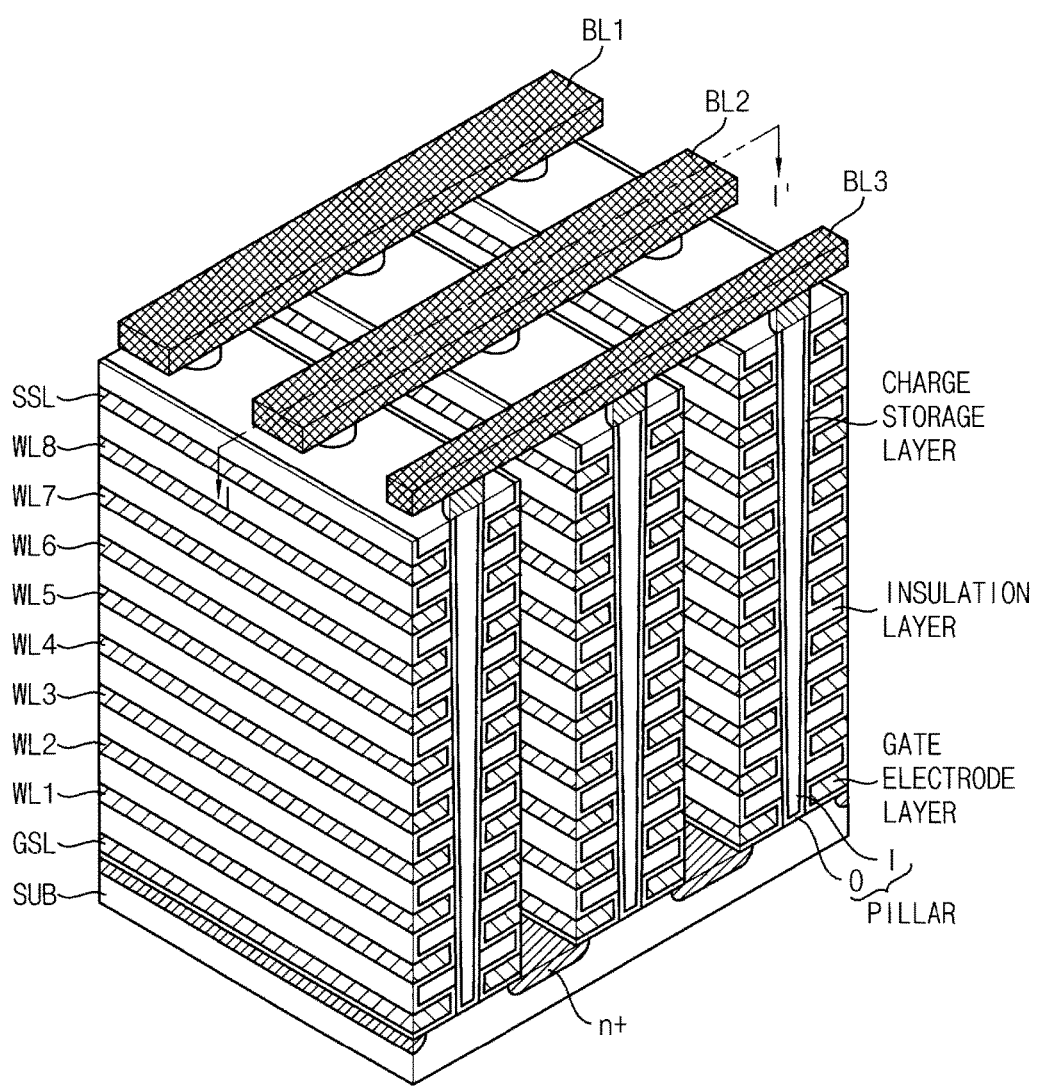
FIG. 13 is a perspective view illustrating a three-dimensional embodiment of the memory cell array included in the non-volatile memory device of FIG. 11.

FIG. 13 is a perspective view illustrating a three-dimensional embodiment of the memory cell array included in the non-volatile memory device of FIG. 11.

Referring to FIG. 13, the memory cell array 930A may be formed in a direction perpendicular to a substrate SUB. An n+ doped region may be formed in the substrate SUB. A gate electrode layer and an insulation layer may be alternately deposited on the substrate SUB. Also, a charge storage layer may be formed between the gate electrode layer and the insulation layer.

When the gate electrode layer and the insulation layer are vertically patterned, a V-shaped pillar may be formed. The pillar may penetrate the gate electrode layer and the insulation layer to be connected to the substrate SUB. The outer portion O of the pillar may be configured with a channel semiconductor, and the inner portion I of the pillar may be configured with an insulation material such as silicon oxide.

The gate electrode layer may be connected to the ground selection line GSL, the plurality of word lines WL1~WL8, and the string selection line SSL. The pillar may be connected to the plurality of bit lines BL1~BL3.

It is illustrated in FIG. 13, that the memory cell array 930A has the ground selection line GSL, the string selection line SSL, eight word lines WL1~WL8, and three bit lines BL1 to BL3 as an example, but embodiments are not limited thereto.

Figure 14:
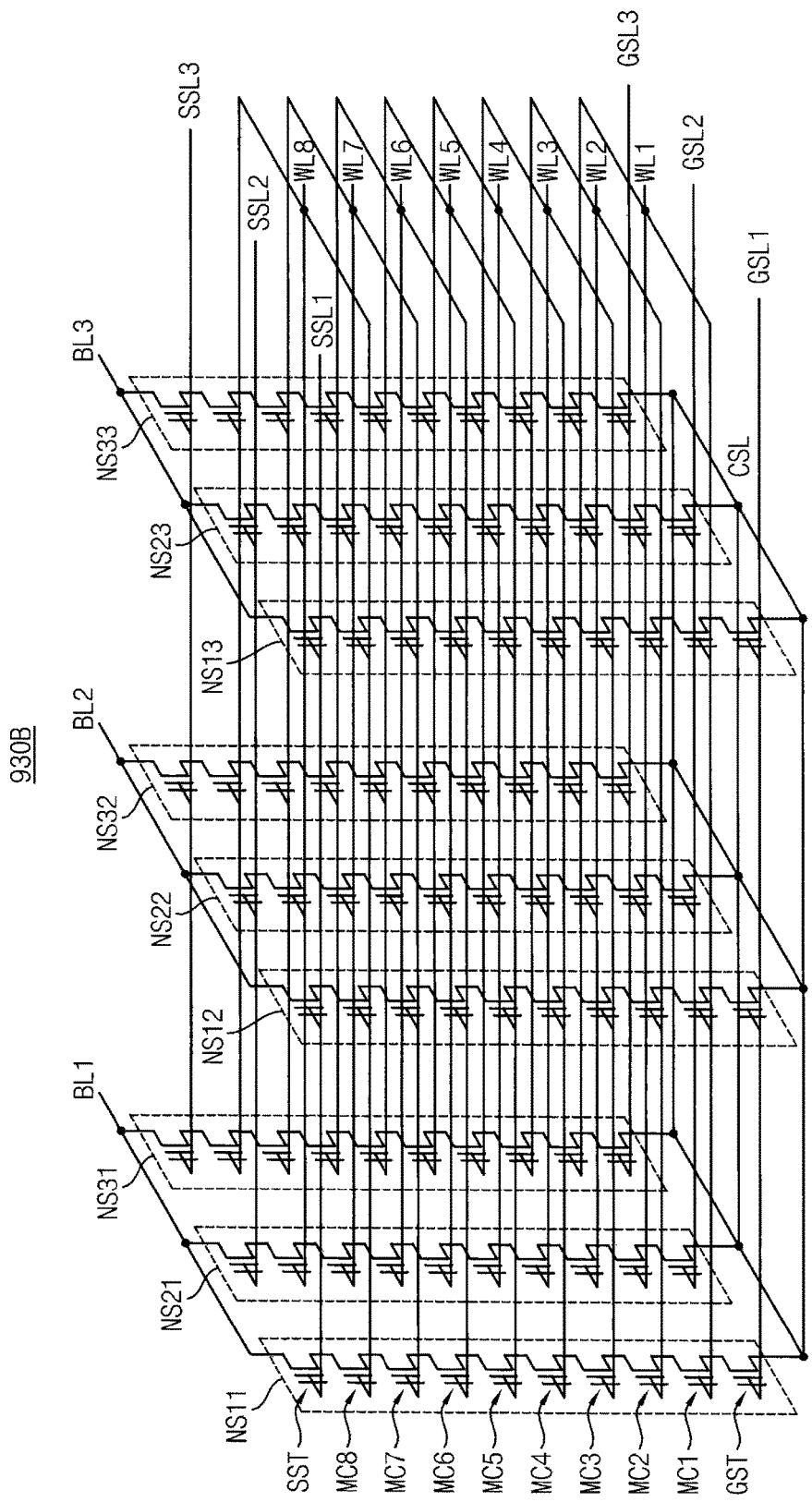
FIG. 14 is an equivalent circuit illustrating the memory cell array of FIG. 13.

FIG. 14 is an equivalent circuit 930B illustrating the memory cell array of FIG. 13.

Referring to FIG. 14, NAND strings NS11~NS33 may be connected between the bit lines BL1~BL3 and a common source line CSL. Each NAND string (e.g., NS11) may include a string selection transistor SST, a plurality of memory cells MC1~MC8, and a ground selection transistor GST.

Each of string selection transistors SST may be connected to one of string selection lines SSL1~SSL3. A plurality of memory cells MC1~MC8 may be connected to corresponding word lines WL1~WL8, respectively. Each of ground selection transistors GST may be connected to one of ground selection lines GSL1~GSL3. Each of string selection transistors SST may also be connected to one of the bit lines BL1~BL3, and each of ground selection transistors GST may be further connected to the common source line CSL.

Referring again to FIG. 14, word lines (e.g., WL1) having the same height may be commonly connected and the ground selection lines GSL1~GSL3 and the string selection lines SSL1~SSL3 may be separated. For example, when a physical page that includes memory cells connected to the first word line WL1 and included in the NAND strings NS11, NS12, and NS13 is programmed, the first word line WL1, the first string selection lines SSL1, and the first ground selection line GSL1 may be selected.

Figure 15:
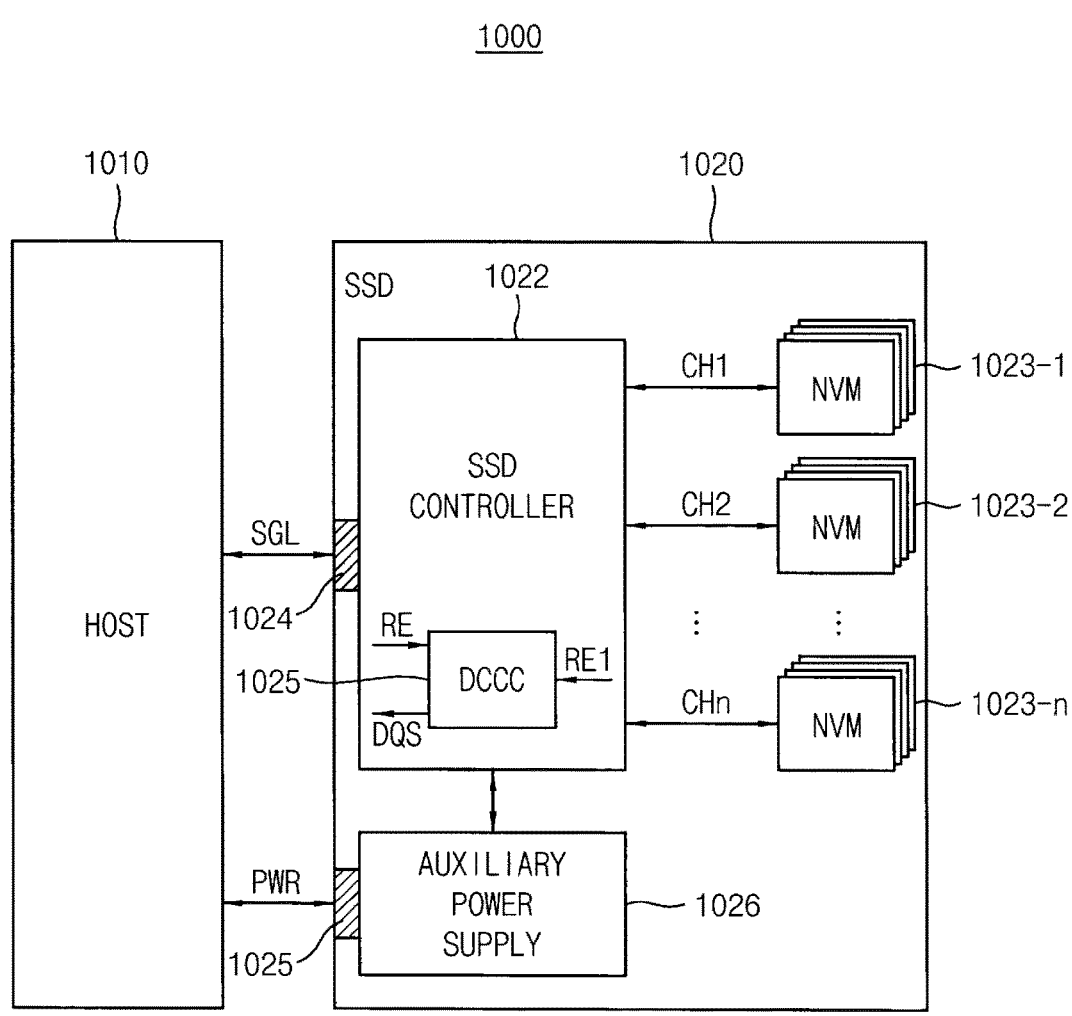
FIG. 15 is a block diagram illustrating a solid-state drive system including the duty cycle correction circuit of FIG. 12.

FIG. 15 is a block diagram illustrating a solid-state drive (SSD) system including the duty cycle correction circuit of FIG. 12.

Referring to FIG. 15, an SSD system 1000 includes a host 1010 and an SSD 1020.

The SSD 1020 includes first through n-th non-volatile memory devices 1023-1, 1023-2, . . . , 1023-n and an SSD controller 1022. Here, n represents an integer greater than or equal to two.

The first through n-th non-volatile memory devices 1023-1, 1023-2, . . . , 1023-n may be used as a storage medium of the SSD 1020.

Each of the first through n-th non-volatile memory devices 1023-1, 1023-2, . . . , 1023-n may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on the references to FIGS. 13 and 14.

The 3D memory cell array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The SSD controller 1022 may include a duty cycle correction circuit 1025. The duty cycle correction circuit 1025 may generate a data strobe signal DQS based on a second read clock signal RE1 which is changed from a first read clock signal RE during a reading procedure of the SSD system 1000. The host 1010 may provide the first read clock signal RE to the SSD controller 1022. The first through n-th non-volatile memory devices 1023-1, 1023-2, . . . , 1023-n may provide the second read clock signal RE1 to the SSD controller 1022 through the plurality of channels CH1, CH2, CHn.

The duty cycle correction circuit 1025 may be embodied with the duty cycle correction circuit DCCC of FIG. 12. The duty cycle correction circuit 1025 may be understood based on the reference to FIG. 12.

The SSD controller 1022 is coupled to the first through n-th non-volatile memory devices 1023-1, 1023-2, . . . , 1023-n by first through n-th channels CH1, CH2, CHn, respectively. The SSD controller 1022 may exchange a signal SGL with the host 1010 through a signal connector 1024. The signal SGL may include a command signal, an address signal, a data strobe signal, a data signal, a first read clock signal, a write clock signal, and a use signal. The SSD controller 1022 may perform a program operation and a read operation on the first through n-th non-volatile memory devices 1023-1, 1023-2, . . . , 1023-n according to the command received from the host 1010.

The SSD 1020 may further include an auxiliary power supply 1026. The auxiliary power supply 1026 may receive power PWR from the host 1010 through a power connector 1025 and provide power to the SSD controller 1022. The auxiliary power supply 1026 may be placed inside or outside the SSD 1020. For example, the auxiliary power supply 1026 may be placed in a main board and provide auxiliary power to the SSD 1020.

Figure 16:
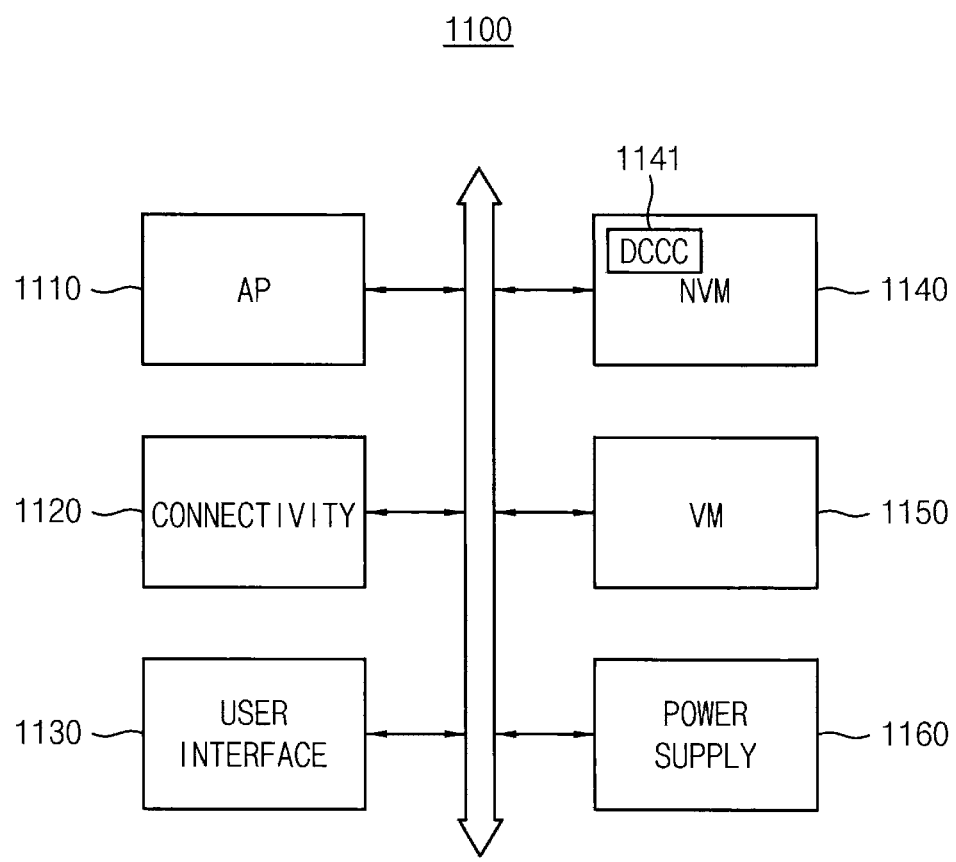
FIG. 16 is a block diagram illustrating a mobile system including the duty cycle correction circuit of FIG. 12.

FIG. 16 is a block diagram illustrating a mobile system including the duty cycle correction circuit of FIG. 12.

Referring to FIG. 16, a mobile system 1100 includes an application processor AP 1110, a connectivity unit 1120, a user interface 1130, a non-volatile memory device NVM 1140, a volatile memory device VM 1150 and a power supply 1160.

In some embodiments, the mobile system 1100 may be a mobile phone, a smart phone, a personal digital assistant (PDA), a portable multimedia player (PMP), a digital camera, a music player, a portable game console, a navigation system, etc.

The application processor 1110 may execute applications, such as a web browser, a game application, a video player, etc. In some example embodiments, the application processor 1110 may include a single core or multiple cores. For example, the application processor 1110 may be a multi-core processor, such as a dual-core processor, a quad-core processor, a hexa-core processor, etc. The application processor 1110 may include an internal or external cache memory.

The connectivity unit 1120 may perform wired or wireless communication with an external device. For example, the connectivity unit 1120 may perform Ethernet communication, near field communication (NFC), radio frequency identification (RFID) communication, mobile telecommunication, memory card communication, universal serial bus (USB) communication, etc. In some embodiments, the connectivity unit 1120 may include a baseband chipset that supports communications, such as global system for mobile communications (GSM), general packet radio service (GPRS), wideband code division multiple access (WCDMA), high speed downlink/uplink packet access (HSxPA), etc.

The non-volatile memory device 1140 may store a boot image for booting the mobile system 1100.

The non-volatile memory device 1140 may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on the references to FIGS. 13 and 14.

The 3D memory cell array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The non-volatile memory device 1140 may include a duty cycle correction circuit 1141. The duty cycle correction circuit 1141 may generate a data strobe signal based on a second read clock signal which is changed from a first read clock signal during a reading procedure of the non-volatile memory device 1140.

The duty cycle correction circuit 1141 may be embodied with the duty cycle correction circuit DCCC of FIG. 12. The duty cycle correction circuit 1141 may be understood based on the reference to FIG. 12.

The volatile memory device 1150 may store data processed by the application processor 1110, or may operate as a working memory.

The user interface 1130 may include at least one input device, such as a keypad, a touch screen, etc., and at least one output device, such as a speaker, a display device, etc.

The power supply 1160 may supply a power supply voltage to the mobile system 1100.

In some embodiments, the mobile system 1100 may further include an image processor, and/or a storage device, such as a memory card, a solid state drive (SSD), a hard disk drive (HDD), a CD-ROM, etc.

In some embodiments, the mobile system 1100 and/or components of the mobile system 1100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 17:
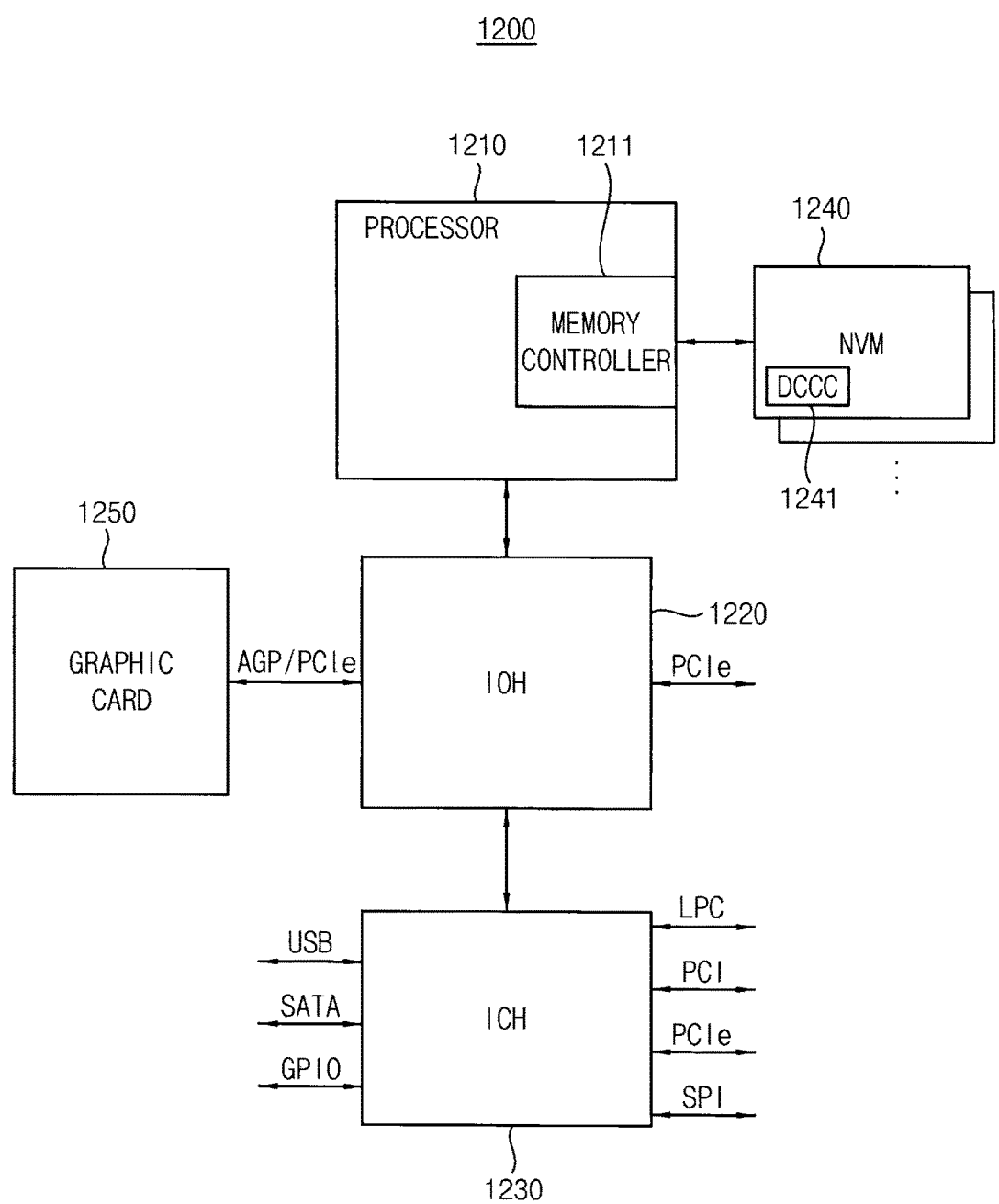
FIG. 17 is a block diagram illustrating a computing system including the duty cycle correction circuit of FIG. 12.

FIG. 17 is a block diagram illustrating a computing system including the duty cycle correction circuit of FIG. 12.

Referring to FIG. 17, a computing system 1200 includes a processor 1210, an I/O hub IOH 1220, an I/O controller hub ICH 1230, at least one non-volatile memory device 1240 and a graphic card 1250. According to example embodiments, the computing system 1200 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 1210 may perform specific calculations or tasks. For example, the processor 1210 may be a microprocessor, a central process unit (CPU), a digital signal processor, or the like. According to example embodiments, the processor 1210 may include a single processor core or a plurality of processor cores. For example, the processor 1210 may be a multi-core processor, such as a dual-core processor, a quad-core processor, a hexa-core processor, etc. Although FIG. 17 illustrates an example of the computing system 1200 including one processor 1210, according to example embodiments, the computing system 1200 may include a plurality of processors. In some example embodiments, the processor 1210 may further include a cache memory located inside or outside the processor 1210.

The processor 1210 may include a memory controller 1211 that controls an operation of the non-volatile memory device 1240. The memory controller 1211 included in the processor 1210 may be referred to as an integrated memory controller (IMC). A memory interface between the memory controller 1211 and the non-volatile memory device 1240 may be implemented by one channel including a plurality of signal lines, or by a plurality of channels. Each channel may be coupled to at least one non-volatile memory device 1240. In some example embodiments, the memory controller 1211 may be included in the I/O hub 1220. The I/O hub 1220 including the memory controller 1211 may be referred to as a memory controller hub (MCH).

The non-volatile memory device 1240 may include a memory cell array formed on a substrate in a three-dimensional (3D) structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate. The memory cell array having the three-dimensional structure may be understood based on the references to FIGS. 13 and 14.

The 3D memory cell array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The following patent documents, which are hereby incorporated by reference, describe suitable configurations for the 3D memory cell arrays, in which the three-dimensional memory cell array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The non-volatile memory device 1240 may include a duty cycle correction circuit 1241. The duty cycle correction circuit 1241 may generate a data strobe signal based on a second read clock signal which is changed from a first read clock signal during a reading procedure of the non-volatile memory device 1240.

The duty cycle correction circuit 1241 may be embodied with the duty cycle correction circuit DCCC of FIG. 12. The duty cycle correction circuit 1241 may be understood based on the reference to FIG. 12.

The I/O hub 1220 may manage data transfer between the processor 1210 and devices, such as the graphic card 1250. The I/O hub 1220 may be coupled to the processor 1210 via at least one of various interfaces, such as a front side bus (FSB), a system bus, a HyperTransport, a lightning data transport (LDT), a QuickPath interconnect (QPI), a common system interface (CSI), etc. Although FIG. 17 illustrates an example of the computing system 1200 including one I/O hub 1220, according to example embodiments, the computing system 1200 may include a plurality of I/O hubs.

The I/O hub 1220 may provide various interfaces with the devices. For example, the I/O hub 1220 may provide an accelerated graphics port (AGP) interface, a peripheral component interface-express (PCIe), a communications streaming architecture (CSA) interface, etc.

The graphic card 1250 may be coupled to the I/O hub 1220 via the AGP or the PCIe. The graphic card 1250 may control a display device (not illustrated) for displaying an image. The graphic card 1250 may include an internal processor and an internal memory to process the image. In some example embodiments, the input/output hub 1220 may include an internal graphic device along with or instead of the graphic card 1250. The internal graphic device may be referred to as an integrated graphics, and an I/O hub including the memory controller and the internal graphic device may be referred to as a graphics and memory controller hub (GMCH).

The I/O controller hub 1230 may perform data buffering and interface arbitration to efficiently operate various system interfaces. The I/O controller hub 1230 may be coupled to the I/O hub 1220 via an internal bus. For example, the I/O controller hub 1230 may be coupled to the I/O hub 1220 via at least one of various interfaces, such as a direct media interface (DMI), a hub interface, an enterprise Southbridge interface (ESI), PCIe, etc.

The I/O controller hub 1230 may provide various interfaces with peripheral devices. For example, the I/O controller hub 1230 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some example embodiments, the processor 1210, the I/O hub 1220 and the I/O controller hub 1230 may be implemented as separate chipsets or separate integrated circuits. In other embodiments, at least two of the processor 1210, the I/O hub 1220 and the I/O controller hub 1230 may be implemented as one chipset.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A Schmitt trigger circuit comprising:
    a first inverter including a PMOS transistor unit and an NMOS transistor unit which generate an internal signal by inverting an input signal based on a first feedback signal and provide the internal signal to a first node;
    a second inverter configured to generate an output signal by inverting a first signal provided by the first node;
    a first feedback unit configured to generate the first feedback signal providing a first hysteresis character to the NMOS transistor unit based on the first signal of the first node; and
    a second feedback unit configured to generate a second feedback signal providing a second hysteresis character to the PMOS transistor unit based on the output signal, the second feedback unit configured to provide the second feedback signal to the first node and the second hysteresis character having the same size as the first hysteresis character, wherein:
    the first signal is a combination of the internal signal and the second feedback signal, and
    the PMOS transistor unit comprises no more than one PMOS transistor having a gate terminal receiving the input signal, a source terminal receiving a supply voltage that is invariant to voltage variations of the input signal, and a drain terminal connected to the first node.

2. The Schmitt trigger circuit of claim 1, wherein:
    the PMOS transistor unit and the NMOS transistor unit have different current driving powers with respect to the supply voltage, and
    a ratio of the first feedback signal and the second feedback signal is controlled according to a ratio of the current driving powers of the PMOS transistor unit and the NMOS transistor unit such that the first hysteresis character and the second hysteresis character have the same size.

3. The Schmitt trigger circuit of claim 1, wherein:
the NMOS transistor unit includes:
  a first NMOS transistor having a gate terminal receiving the input signal, a drain terminal connected to a second node, and a source terminal receiving a ground voltage; and
  a second NMOS transistor having a gate terminal receiving the input signal, a drain terminal connected to the first node, and a source terminal connected to the second node,
the first feedback unit includes a third NMOS transistor having a gate terminal connected to the first node, a drain terminal receiving the supply voltage, and a source terminal connected the second node,
the third NMOS transistor provides the first feedback signal to the second node,
the second feedback unit includes a fourth NMOS transistor having a gate terminal receiving the output signal, a drain terminal connected to the first node, and a source terminal receiving the ground voltage,
the fourth NMOS transistor provides the second feedback signal to the first node, and
a channel width/length (W/L) ratio of the third NMOS transistor and a channel W/L ratio of the fourth NMOS transistor are controlled such that the first hysteresis character and the second hysteresis character have the same size.

4. The Schmitt trigger circuit of claim 3, further comprising:
  a second PMOS transistor having a gate terminal receiving the output signal, a drain terminal receiving the supply voltage, and a source terminal connected to the first node, wherein
  the second PMOS transistor provides a third feedback signal, which provides a supplemental hysteresis character for the NMOS transistor unit, to the first node.

5. The Schmitt trigger circuit of claim 3, wherein:
a voltage level of the output signal is changed from a logical low level to a logical high level when the voltage level of the output signal is the logical low level and a voltage level of the input signal increases through a trigger voltage, and
the trigger voltage is determined based on a turn-on resistance of the first NMOS transistor and a turn-on resistance of the third NMOS transistor.

6. The Schmitt trigger circuit of claim 3, wherein:
a voltage level of the output signal is changed from a logical high level to a logical low level when the voltage level of the output signal is the logical high level and a voltage level of the input signal decreases through a trigger voltage, and
the trigger voltage is determined based on a current driving power of the one PMOS transistor and a current driving power of the fourth NMOS transistor.

7. The Schmitt trigger circuit of claim 1, wherein the PMOS transistor unit does not receive a feedback signal based on the first signal of the first node.

8. A phase interpolator comprising:
a phase mixer configured to generate a mixed signal by mixing a first input signal and a second input signal; and
a Schmitt trigger circuit configured to generate an output signal by clarifying a logical level of the mixed signal, wherein the Schmitt trigger circuit includes:
  a first inverter including a PMOS transistor unit and an NMOS transistor unit which generate an internal signal by inverting the mixed signal based on a first feedback signal and provide the internal signal to a first node;
  a second inverter configured to generate the output signal by inverting a first signal provided by the first node;
  a first feedback unit configured to generate the first feedback signal providing a first hysteresis character to the NMOS transistor unit based on the first signal of the first node; and
  a second feedback unit configured to generate a second feedback signal providing a second hysteresis character to the PMOS transistor unit based on the output signal, the second feedback unit configured to provide the second feedback signal to the first node, and the second hysteresis character having the same size as the first hysteresis character, wherein:
the first signal is a combination of the internal signal and the second feedback signal, and
the PMOS transistor unit comprises no more than one PMOS transistor having a gate terminal receiving the mixed signal, a source terminal receiving a supply voltage that is invariant to voltage variations of the mixed signal, and a drain terminal connected to the first node.

9. The phase interpolator of claim 8, wherein:
the PMOS transistor unit and the NMOS transistor unit have different current driving powers with respect to the supply voltage, and
a ratio of the first feedback signal and the second feedback signal is controlled according to a ratio of the current driving powers of the PMOS transistor unit and the NMOS transistor unit such that the first hysteresis character and the second hysteresis character have the same size.

10. The phase interpolator of claim 8, wherein the phase mixer includes:
  a third inverter having an input terminal receiving the first input signal, and an output terminal connected to an output node which the mixed signal is outputted from;
  a fourth inverter having an input terminal receiving the second input signal, and an output terminal connected to the output node; and
  a capacitor having a first terminal connected to the output node, and a second terminal receiving a ground voltage.

11. The phase interpolator of claim 8, wherein:
the NMOS transistor unit includes:
  a first NMOS transistor having a gate terminal receiving the mixed signal, a drain terminal connected to a second node, and a source terminal receiving a ground voltage; and
  a second NMOS transistor having a gate terminal receiving the mixed signal, a drain terminal connected to the first node, and a source terminal connected to the second node,
the first feedback unit includes a third NMOS transistor having a gate terminal connected to the first node, a drain terminal receiving the supply voltage, and a source terminal connected the second node,
the third NMOS transistor provides the first feedback signal to the second node,
the second feedback unit includes a fourth NMOS transistor having a gate terminal receiving the output signal, a drain terminal connected to the first node, and a source terminal receiving the ground voltage, the fourth NMOS transistor provides the second feedback signal to the first node, and a channel width/length (W/L) ratio of the third NMOS transistor and a channel W/L ratio of the fourth NMOS transistor are controlled such that the first hysteresis character and the second hysteresis character have the same size.

* * * * *